(12) United States Patent
Sakairi et al.

(10) Patent No.: US 10,566,403 B2
(45) Date of Patent: Feb. 18, 2020

(54) DISPLAY DEVICE, MANUFACTURING METHOD FOR DISPLAY DEVICE, AND ELECTRONIC DEVICE WITH SUBSTRATE SPACER

(71) Applicant: Sony Corporation, Tokyo (JP)

(72) Inventors: Takashi Sakairi, Kanagawa (JP); Kensaku Maeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 17 days.

(21) Appl. No.: 15/551,737

(22) PCT Filed: Nov. 9, 2015

(86) PCT No.: PCT/JP2015/081429
§ 371 (c)(1),
(2) Date: Aug. 17, 2017

(87) PCT Pub. No.: WO2016/136042
PCT Pub. Date: Sep. 1, 2016

(65) Prior Publication Data
US 2018/0040681 A1 Feb. 8, 2018

(30) Foreign Application Priority Data
Feb. 24, 2015 (JP) ................. 2015-034036

(51) Int. Cl.
G09G 3/30 (2006.01)
H01L 27/32 (2006.01)
(Continued)

(52) U.S. Cl.
CPC ........ *H01L 27/3265* (2013.01); *H01L 27/322* (2013.01); *H01L 27/3213* (2013.01);
(Continued)

(58) Field of Classification Search
CPC ......................................... G09G 2300/04–089
See application file for complete search history.

(56) References Cited

U.S. PATENT DOCUMENTS

2001/0055384 A1* 12/2001 Yamazaki ............. G06F 3/0202
379/419
2002/0021274 A1* 2/2002 Koyama ............... G09G 3/3266
345/98

(Continued)

FOREIGN PATENT DOCUMENTS

JP 2003-255850 A 9/2003
JP 2008-165108 A 7/2008
(Continued)

*Primary Examiner* — Sanghyuk Park
(74) *Attorney, Agent, or Firm* — Michael Best & Friedrich LLP

(57) ABSTRACT

A display device of the present disclosure includes: a first substrate on which a pixel including a light emitting portion is formed; a second substrate arranged in a manner facing the first substrate; a color filter provided between the first substrate and the second substrate; and a substrate spacing setting unit provided in at least a peripheral portion of a display area of the first substrate made by forming pixels, and adapted to set substrate spacing between the first substrate and the second substrate. The substrate spacing setting unit is formed of at least two layers including: a first adjustment layer formed in a predetermined pattern on the first substrate; and a second adjustment layer stacked on the first adjustment layer in a step of forming the color filter by using a material same as a material of the color filter.

19 Claims, 16 Drawing Sheets

(51) Int. Cl.
*H01L 51/52* (2006.01)
*H01L 51/56* (2006.01)
*H05B 33/04* (2006.01)
*H05B 33/06* (2006.01)
*H05B 33/12* (2006.01)

(52) U.S. Cl.
CPC ........ *H01L 51/525* (2013.01); *H01L 51/5221* (2013.01); *H01L 51/5246* (2013.01); *H01L 51/56* (2013.01); *H05B 33/04* (2013.01); *H05B 33/06* (2013.01); *H05B 33/12* (2013.01); *H01L 2227/323* (2013.01)

(56) References Cited

U.S. PATENT DOCUMENTS

| 2007/0058125 | A1* | 3/2007 | Yoo | G02F 1/133516 |
| | | | | 349/152 |
| 2015/0041772 | A1 | 2/2015 | Han | |
| 2016/0041663 | A1* | 2/2016 | Chen | G06F 3/0412 |
| | | | | 345/174 |

FOREIGN PATENT DOCUMENTS

| JP | 2009-163975 A | 7/2009 |
| JP | 2009-210926 A | 9/2009 |
| JP | 2012-159757 A | 8/2012 |
| JP | 2014-178616 A | 9/2014 |

\* cited by examiner

DISPLAY DEVICE, MANUFACTURING METHOD FOR DISPLAY DEVICE, AND ELECTRONIC DEVICE WITH SUBSTRATE SPACER

TECHNICAL FIELD

The present disclosure relates to a display device, a manufacturing method for the display device, and an electronic device, and particularly, relates to a flat-type display device, a manufacturing method therefor, and an electronic device including the display device.

BACKGROUND ART

A flat-type (flat panel type) display device has a sealing structure obtained by pasting a second substrate such as a glass substrate to a first substrate on which a light emitting portion is formed from a stand point of protecting the light emitting portion (light emitting element). At the time of such pasting, appropriate substrate spacing is ensured by providing a gap material in a peripheral portion of a display area formed by arranging pixels including light emitting portions in order that the first substrate and the second substrate are prevented from contacting each other (Refer to Patent Document 1, for example).

CITATION LIST

Patent Document

Patent Document 1: JP 2009-163975 A

SUMMARY OF THE INVENTION

Problems to be Solved by the Invention

In above-described related art disclosed in Patent Literature 1, provided is a structure in which a sealing material including gap materials is made to have a function as a spacer by coating a peripheral portion of a display area with the sealing material in which the gap materials are dispersed inside a resin made of a photo-curable epoxy resin material. However, in the related art, adjusting substrate spacing may be difficult because the number of steps is increased by generating a step to provide a spacer and also substrate spacing is determined by a size of the spacer itself.

Considering the above, the present disclosure is directed to providing a display device including a spacer in which substrate spacing can be easily adjusted without generating any step to provide a spacer, and an electronic device including the display device.

Solutions to Problems

A display device of the present disclosure to achieve the above-described objects includes:
a first substrate on which a pixel including a light emitting portion is formed;
a second substrate arranged in a manner facing the first substrate;
a color filter provided between the first substrate and the second substrate; and
a substrate spacing setting unit provided in at least a peripheral portion of a display area of the first substrate made by forming pixels, and adapted to set substrate spacing between the first substrate and the second substrate,
in which the substrate spacing setting unit is formed of at least two layers including:
a first adjustment layer formed in a predetermined pattern on the first substrate; and
a second adjustment layer stacked on the first adjustment layer in a step of forming the color filter by using a material same as a material of the color filter. Additionally, an electronic device of the present disclosure to achieve the above-described objects includes a display device including the above-configuration.

Additionally, according to a manufacturing method for a display device of the present disclosure to achieve the above-described objects, the display device includes:
a first substrate on which a pixel including a light emitting portion is formed;
a second substrate arranged in a manner facing the first substrate;
a color filter provided between the first substrate and the second substrate; and
a substrate spacing setting unit provided in at least a peripheral portion of a display area of the first substrate made by forming pixels, and adapted to set substrate spacing between the first substrate and the second substrate, and
the manufacturing method includes:
forming a first adjustment layer in a predetermined pattern on the first substrate; and
subsequently stacking a second adjustment layer on the first adjustment layer in a step of forming the color filter by using a material same as a material of the color filter to form the substrate spacing setting unit including at least two layers.

According to the display device having the above-described configuration, the manufacturing method thereof, or the electronic device including the display device, a step to provide the substrate spacing setting unit having a function as a spacer is not needed because the substrate spacing setting unit can be formed in the step of forming the color filter by using the material same as the material of the color filter. Additionally, since the second adjustment layer is stacked on the first adjustment layer formed in a pattern, a film thickness difference is generated between a recessed portion and a projecting portion of the first adjustment layer due to fluidity of the material itself of the second adjustment layer. Therefore, a thickness of the second layer, furthermore, a total height of the substrate spacing setting unit can be adjusted by adjusting pattern density of the first adjustment layer. As a result, substrate spacing between the first substrate and the second substrate, which is determined by the height of the substrate spacing setting unit, can be easily adjusted.

Effects of the Invention

According to the present disclosure, the step to provide the substrate spacing setting unit is not needed because the substrate spacing setting unit can be formed in the step of forming the color filter by using the material same as the material of the color filter. Furthermore, since the height of the substrate spacing setting unit can be adjusted by adjusting pattern density of the first adjustment layer, substrate spacing between the first substrate and the second substrate can be easily adjusted.

Note that effects are not limited to those recited herein but may be any one of those recited in the present specification. Additionally, note that the effects described in the present specification are only examples and not limited thereto, and further additional effects may also be provided.

BRIEF DESCRIPTION OF DRAWINGS

FIG. 15A is a front view thereof, and FIG. 15B is a rear view thereof.

MODE FOR CARRYING OUT THE INVENTION

Figure 1:
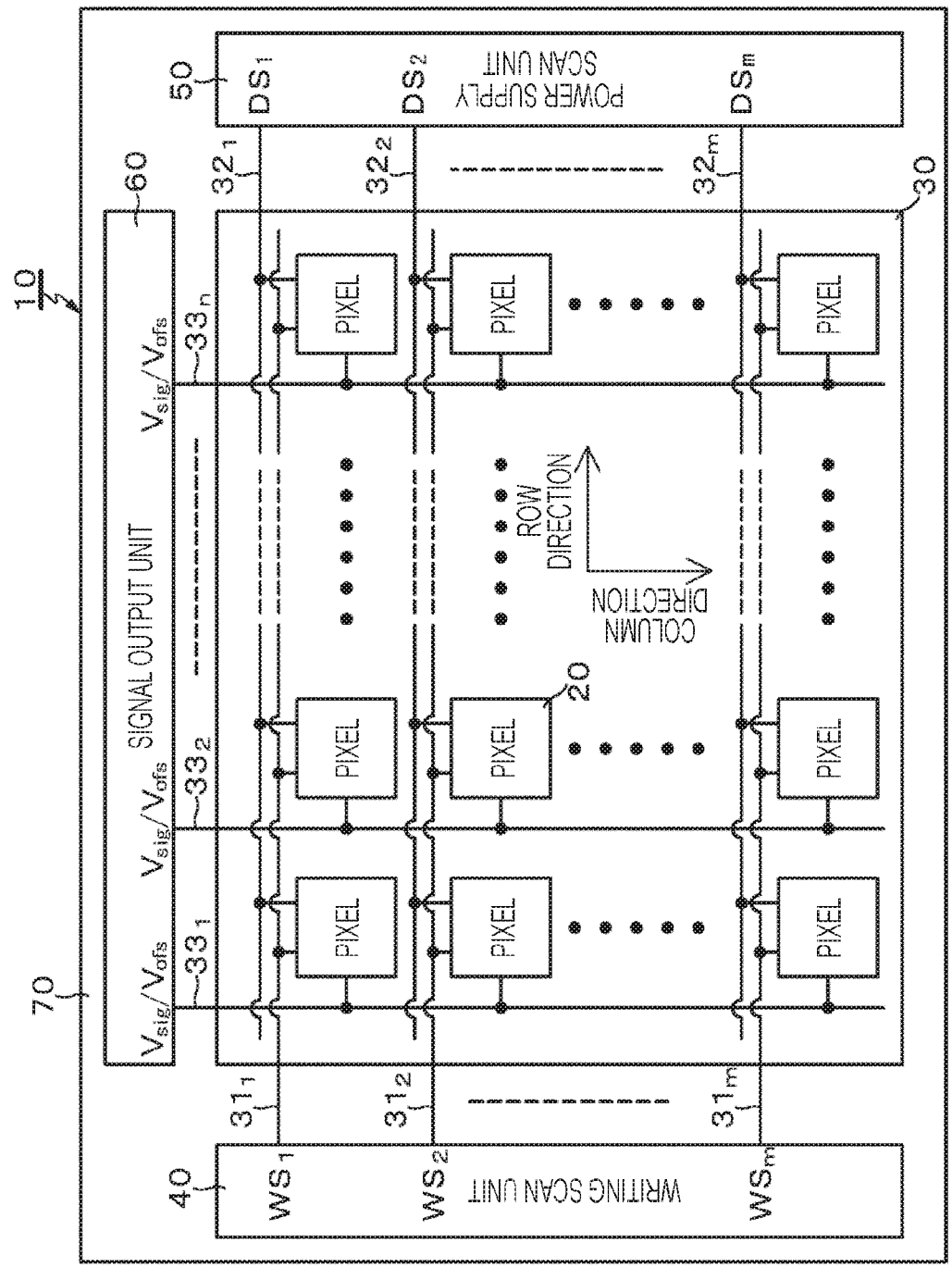
FIG. 1 is a system configuration diagram schematically illustrating a basic configuration of an active matrix organic EL display device as a premise of the present disclosure.

In the following, modes (hereinafter referred to as "embodiments") to implement the technology of the present disclosure will be described in detail with reference to the drawings. The technology of the present disclosure is not limited to the embodiments, and various numerical values and materials in the embodiments are examples. In the following description, a same reference sign will be used for a same element or an element having a same function, and repetition of the same description will be omitted. Note that the description will be provided in the following order.

1. General Description for Display Device, Manufacturing Method for Display Device, and Electronic Device of Present Disclosure
2. Display Device as Premise of Present Disclosure
2-1. System Configuration
2-2. Pixel Circuit
2-3. Color Display Method
2-4. Sealing Structure of Display Panel
3. First Embodiment
3-1. Method of Forming Color Resist
3-2. Stacked Structure of Spacer
4. Second Embodiment
5. Electronic Device <General Description for Display Device, Manufacturing Method for Display Device, and Electronic Device of Present Disclosure>

A display device of the present disclosure is a color display device formed by arranging, in a matrix, unit pixels including a plurality of subpixels having different emission colors. In the color display device, one pixel is formed of three subpixels including a red light emitting subpixel to emit red light, a green light emitting subpixel to emit green light, and a blue light emitting subpixel to emit blue light, or four or more subpixels.

According to the color display device, a light-emitting function layer in one subpixel can have a configuration to emit white light. Also, a light-emitting function layer in one subpixel may have a configuration formed by stacking a red light-emitting function layer to emit red light, a green light-emitting function layer to emit green light, and a blue light-emitting function layer to emit blue light. A display device having the light-emitting function layer in one subpixel formed of a white light-emitting function layer can a configuration including a color filter, and a subpixel of each color can be formed by combining the color filter with a light emitting portion (light emitting element) that emits white light.

Additionally, the color display device can have a configuration in which a light-emitting function layer in one subpixel can be formed of, for example, a red light-emitting function layer to emit red light, a green light-emitting function layer to emit green light, and a blue light-emitting function layer to emit blue light. Such a color display device can also have a configuration using the color filter in order to prevent external light reflection at a light emitting element and a wiring electrode between the elements, and to improve color purity.

According to the display device, a manufacturing method for the display device, and an electronic device of the present disclosure, a substrate spacing setting unit as a spacer to set substrate spacing between a first substrate and a second substrate is provided in at least a peripheral region of a display area of the first substrate. In other words, it is not intended to exclude a structure in which the substrate spacing setting unit is provided within the display area. Additionally, for a material of a second adjustment layer made of a material same as a material of the color filter, a filter material of any color of the color filter including a plurality of colors may be used. As for the number of layers of the substrate spacing setting unit, a stacked configuration formed of at least two layers including a first adjustment layer and the second adjusting layer is preferred, and furthermore, it is possible to adopt a multi-layer structure in which layers are further stacked on the second adjustment layer by using filter materials of other colors different from the material of the second adjustment layer.

According to the display device, manufacturing method for the display device, and electronic device of the present disclosure including the above-described preferable configuration, the first adjustment layer can be formed in a step of forming the color filter by using a material same as the material of the color filter. In this case, the first adjustment layer is formed by using a filter material of a color different from that of the material of the second adjustment layer.

Alternatively, according to the display device, manufacturing method for the display device, and electronic device of the present disclosure including the above-described preferable configuration, the first adjustment layer can be formed in a pattern by using a metal material. Additionally, the first adjustment layer can be formed of a metal wiring pattern.

Alternatively, according to the display device, manufacturing method for the display device, and electronic device of the present disclosure including the above-described preferable configuration, the first adjustment layer can be formed in a pattern by using an oxide film.

According to the display device, manufacturing method for the display device, and electronic device of the present disclosure including the above-described preferable configuration, the first substrate can be formed of a semiconductor substrate. Additionally, the first substrate can have a configuration including a pad portion that is formed on a surface side (back surface side) on an opposite side of a surface (front surface) on which a pixel is formed, and used for electrical connection to the outside.

According to the display device, manufacturing method for the display device, and electronic device of the present disclosure including the above-described preferable configuration, the display device can have a configuration of an organic electro luminescence (EL) display device having a light emitting portion (light emitting element) formed of an organic EL element in which a plurality of subpixels is a self light emitting element. In other words, a subpixel is formed of each organic EL element in the organic EL display device.

The organic EL display device can be used as, for example, a monitor device constituting a personal computer, a video camera, a digital still camera, and also as a monitor device incorporated in a television receiver, a mobile phone, a personal digital assistant (PDA, portable information terminal), and a game machine. Alternatively, application to an electronic view finder (EVF) or a head mounted display (HMD) called a head mounted display is also possible. Alternatively, a backlight device for a liquid crystal display device or a lighting device including a planar light source device can be further exemplified.

In the organic EL element, an organic layer functioning as a light-emitting function layer includes a light emission layer (for example, a light emission layer made of an organic light emission material). Specifically, the organic layer can be formed of, for example, a stacked structure including a hole transport layer, a light emission layer, and an electron transport layer, a stacked structure including a hole transport layer and a light emission layer serving also as an electron transport layer, a stacked structure including a hole injection layer, a hole transport layer, a light emission layer, an electron transport layer, and an electron injection layer, or the like. Additionally, in the case where the stacked structure or the like is a tandem unit, the organic layer may have a tandem structure including two stages in which a first tandem unit, a connection layer, and a second tandem unit are stacked, or may have a tandem structure including three or more stages in which three or more tandem units are stacked. In these cases, an organic layer that emits white light as a whole can be achieved by setting different emission colors of red, green, and blue for the respective tandem units.

Examples of a forming method for the organic layer can include a physical vapor deposition method (PVD method) such as a vacuum deposition method; a printing method such as a screen printing method and an ink-jet printing method; a laser transfer method in which an organic layer located on a layer absorbing layer is separated and then the organic layer is transferred by irradiating, with laser beams, a stacked structure formed on a transfer substrate and including the layer absorbing layer and the organic layer; and various kinds of coating methods. In the case of forming the organic layer on the basis of the vacuum deposition method, for example, the organic layer can be obtained by using a so-called metal mask and depositing a material that has passed through an opening provided in the metal mask, and also the organic layer may be formed on an entire surface without patterning.

<Display Device as Premise of Present Disclosure]]>
[System Configuration]

FIG. 1 is a system configuration diagram schematically illustrating a basic configuration of an active matrix organic EL display device as a premise of the present disclosure.

The active matrix type display device is a display device in which driving of a light emitting portion (light emitting element) is performed by an active element provided inside a pixel same as the light emitting portion is, for example, an insulated gate type field effect transistor. Typically, a thin film transistor (TFT) can be used as the insulated gate type field effect transistor.

Here, for example, a description will be provided by exemplifying a case where an active matrix organic EL display device in which a light emitting portion (light emitting element) of a unit pixel (pixel circuit) is formed of an organic EL element. The organic EL element is a current driven type electro-optic element in which light emission luminance is varied in accordance with a current value flowing in a device. In the following, a "unit pixel/pixel circuit" may also be simply referred to as a "pixel".

As illustrated in FIG. 1, an active matrix organic EL display device 10 as a premise of the present disclosure includes: a pixel array unit 30 in which a plurality of unit pixels 20 is two-dimensionally arranged in a matrix (two-dimensional matrix); and a drive unit (peripheral circuit) arranged in a peripheral region thereof and adapted to drive the pixels 20. The drive unit includes, for example, a writing scan unit 40, a power supply scan unit 50, a signal output unit 60, and the like, and drives each of the pixels 20 in the pixel array unit 30.

In the present example, the writing scan unit 40, power supply scan unit 50, and signal output unit 60 are mounted as the peripheral circuit of the pixel array unit 30 on a substrate same as the pixel array unit 30 is, in other words, on a display panel 70. However, some or all of the writing scan unit 40, power supply scan unit 50, and signal output unit 60 can be provided outside the display panel 70. Additionally, while the writing scan unit 40 and the power supply scan unit 50 are arranged on one side of the pixel array unit 30, these units can also be arranged on both sides interposing the pixel array unit 30. For the substrate of the display panel 70, a transparent insulation substrate such as a glass substrate can be used or a semiconductor substrate such as a silicon substrate can also be used.

In the organic EL display device 10 supporting color display, one pixel (unit pixel/pixel) to be a unit at the time of forming a color image is formed of subpixels of plurality of colors (subpixels). In this case, each of the subpixels corresponds to the pixel 20 in FIG. 1. More specifically, one pixel in a display device supporting color display is formed of, for example, three subpixels including a subpixel to emit red (R) light, a subpixel to emit green (G) light, and a subpixel to emit blue (B) light.

However, one pixel is not limited to have combination of subpixels of three primary colors of RGB, and one pixel can also be formed by adding a subpixel of one color or a plurality of colors to the subpixels of the three primary colors, More specifically, for example, a subpixel to emit white (W) light can be added to form one pixel in order to improve luminance, or at least one subpixel to emit complementary color light can be added to form one pixel in order to broaden a color reproduction range.

In the pixel array unit 30, a scanning line 31 (each of $31_1$ to $31_m$) and a power supply line 32 (each of $32_1$ to $32_m$) are wired per pixel row in a row direction (pixel array direction in a pixel row/horizontal direction) in an array of the pixels 20 formed of m rows and n columns. Furthermore, a signal line 33 (each of $33_1$ to $33_n$) is wired per pixel column in a column direction (pixel array direction in a pixel column/vertical direction) in the array of the pixels 20 formed of m rows and n columns.

The scanning lines $31_1$ to $31_m$ are respectively connected to output terminals of corresponding rows in the writing scan unit 40. The power supply lines $32_1$ to $32_m$ are respectively connected to output terminals of corresponding rows in the power supply scan unit 50. The signal lines $33_1$ to $33_n$ are respectively connected to output terminals of corresponding columns in the signal output unit 60.

The writing scan unit 40 is formed of a shift register circuit and the like. At the time of writing signal voltage of a video signal to each of the pixels 20 in the pixel array unit 30, the writing scan unit 40 sequentially supplies the scanning lines 31 ($31_1$ to $31_m$) with write scanning signals WS ($WS_1$ to $WS_m$), thereby performing so-called line sequence scan to scan each of the pixels 20 in the pixel array unit 30 row by row.

In a manner similar to the writing scan unit 40, the power supply scan unit 50 is formed of a shift register circuit and the like. The power supply scan unit 50 supplies the power supply lines 32 ($32_1$ to $32_m$) with power supply voltage DS ($DS_1$ to $DS_m$) that can be switched between first power supply voltage $V_{ccp}$ and second power supply voltage $V_{ini}$ lower than the first power supply voltage $V_{ccp}$ in synchronization with the line sequence scan by the writing scan unit 40. As described later, emission/non-emission (optical quenching) of a pixel 20 is controlled by switching the power supply voltage DS between $V_{ccp}$ and $V_{ini}$.

The signal output unit 60 selectively outputs: signal voltage of a video signal that is supplied from a signal supply source (not illustrated) and conforms to luminance information (hereinafter may be simply referred to as "signal voltage") $V_{sig}$; and a reference voltage $V_{ofs}$. Here, the reference voltage $V_{ofs}$ is the voltage to be a reference of the signal voltage $V_{sig}$ of a video signal (for example, voltage corresponding to a black level of a video signal) and is used at the time of threshold correction processing described later.

The signal voltage $V_{sig}$/reference voltage $V_{ofs}$ output from the signal output unit 60 is written in each of the pixels 20 in the pixel array unit 30 per pixel row selected through scanning by the writing scan circuit 40 via the signal line 33 (each of $33_1$ to $33_n$). In other words, the signal output unit 60 adopts a drive mode of line sequence writing to write the signal voltage $V_{sig}$ row by row (line by line).

[Pixel Circuit]

Figure 2:
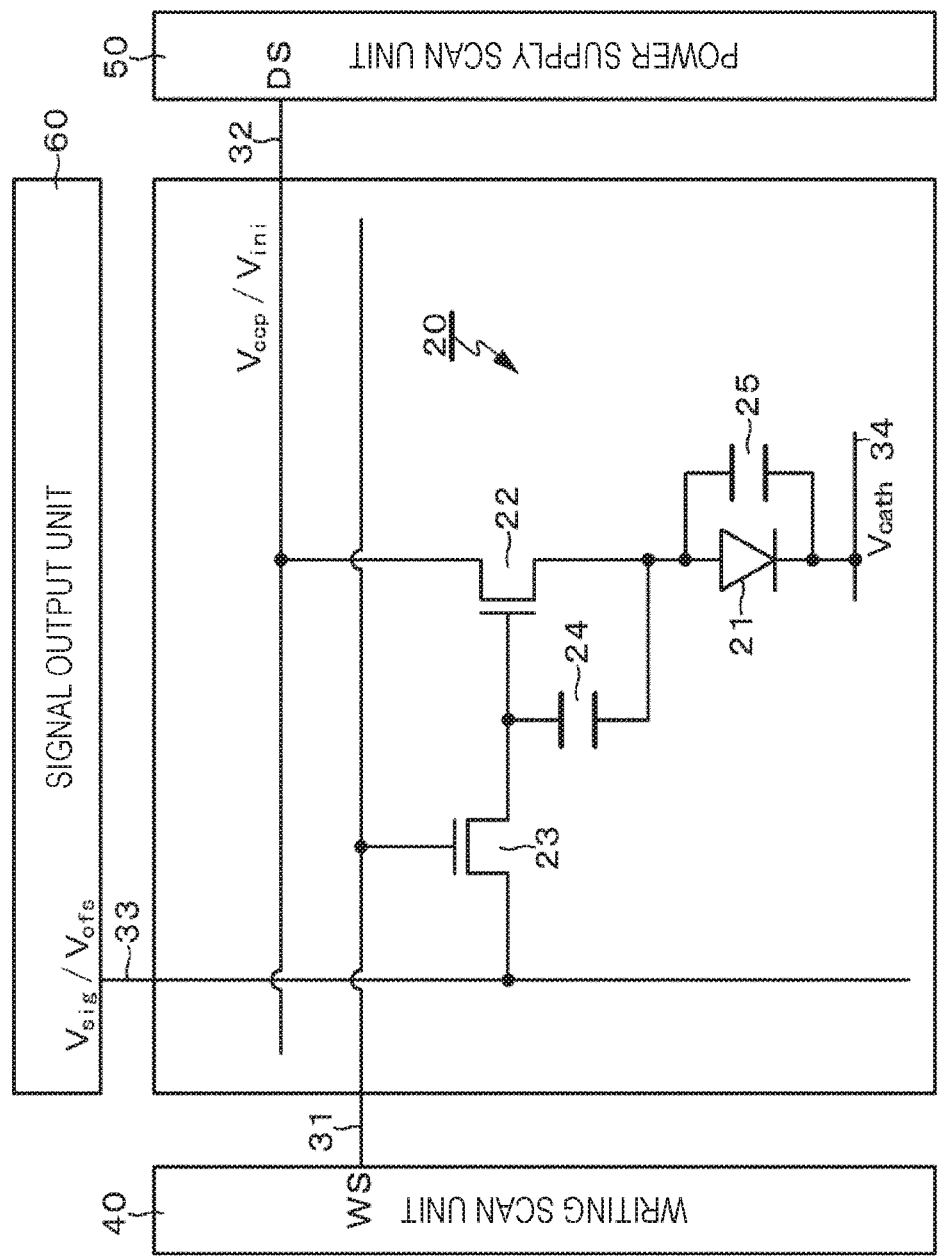
FIG. 2 is a circuit diagram illustrating a circuit configuration of a unit pixel of 2Tr2C (pixel circuit).

FIG. 2 is a circuit diagram illustrating an example of a specific circuit configuration of the unit pixel (pixel circuit) 20. The light emitting portion of the pixel 20 is formed of an organic EL element 21 which is an example of a current driven type electro-optic element in which light emission luminance is varied in accordance with a current value flowing in a device.

As illustrated in FIG. 2, the pixel 20 includes: the organic EL element 21; and a drive circuit to drive the organic EL element 21 by applying current to the organic EL element 21. The organic EL element 21 has a cathode electrode connected to a common power supply line 34 wired in common for all of the pixels 20.

The drive circuit to drive the organic EL element 21 includes a driving transistor 22, a writing transistor 23, a storage capacitor 24, and an auxiliary capacitor 25, that is, a circuit configuration of 2Tr2C including two transistors (Tr) and two capacitive elements (C). Here, N-channel thin film transistors (TFT) are used as the driving transistor 22 and the writing transistor 23. However, combination of conductivity types of the driving transistor 22 and the writing transistor 23 illustrated here is merely an example, and combination thereof is not limited thereto.

The driving transistor 22 has one electrode (source/drain electrode) connected to the power supply line 32 (each of $32_1$ to $32_m$) and has the other electrode (source/drain electrode) connected to an anode electrode of the organic EL element 21. The writing transistor 23 has one electrode (source/drain electrode) connected to the signal line 33 (each of $33_1$ to $33_n$) and has the other electrode (source/drain electrode) connected to a gate electrode of the driving transistor 22. Furthermore, the writing transistor 23 has a gate electrode connected to the scanning line 31 (each of $31_1$ to $31_m$).

In the driving transistor 22 and the writing transistor 23, one electrode represents a metal wire electrically connected to one source/drain region, and the other electrode represents a metal wire electrically connected to the other source/drain region. Additionally, one electrode may become a source electrode or may also become a drain electrode, and the other electrode may become a source electrode and may also become a drain electrode depending on a potential relation between one electrode and the other electrode.

The storage capacitor 24 has one electrode connected to the gate electrode of the driving transistor 22, and has the other electrode connected to the other electrode of the driving transistor 22 and the anode electrode of the organic EL element 21. The auxiliary capacitor 25 has one electrode connected to the anode electrode of the organic EL element 21, and has the other electrode connected to a cathode electrode of the organic EL element 21 respectively, in other words, the auxiliary capacitor 25 is connected in parallel to the organic EL element 21.

In the above configuration, the writing transistor 23 becomes a conductive state in response to a write scanning signal WS applied to the gate electrode from the writing scan unit 40 via the scanning line 31 and changing a high voltage state to an active state. Consequently, the writing transistor 23 samples signal voltage $V_{sig}$ of a video signal that is supplied from the signal output unit 60 at different timings via the signal line 33 and conforms to luminance information, or samples reference voltage $V_{ofs}$, and writes the same inside the pixel 20. The signal voltage $V_{sig}$ or the reference voltage $V_{ofs}$ written by the writing transistor 23 is stored in the storage capacitor 24.

When the power supply voltage DS of the power supply line 32 (each of $32_1$ to $32_m$) is at the first power supply voltage $V_{ccp}$, the driving transistor 22 operates in a saturation region while one electrode functions as a drain electrode and the other electrode functions as a source electrode. Consequently, the driving transistor 22 receives current supply from the power supply line 32 and drives the organic EL element 21 to emit light by current driving. More specifically, the driving transistor 22 operates in the saturation region, thereby supplying the organic EL element 21 with drive current having a current value in accordance with a voltage value of the signal voltage $V_{sig}$ stored in the storage capacitor 24, and causing the organic EL element 21 to emit light by current driving.

Furthermore, when the power supply voltage DS is switched from the first power supply voltage $V_{ccp}$ to the second power supply voltage $V_{ini}$, the driving transistor 22 further operates as a switching transistor while one electrode functions as the source electrode and the other electrode functions as the drain electrode. Consequently, the driving transistor 22 stops supply of the drive current to the organic EL element 21 and brings the organic EL element 21 into a non-light emitting state. In other words, the driving transistor 22 also has a function as a transistor to control emission/non-emission of the organic EL element 21.

A period (non-light emission period) during which the organic EL element 21 becomes the non-light emitting state can be provided by this switching operation of the driving transistor 22, and a ratio (duty) between a light emission period and the non-light emission period of the organic EL element 21 can be controlled. Since afterimage blurring caused when a pixel emits light over one display frame period can be reduced by this duty control, particularly, more excellent image quality of a moving image can be achieved.

The first power supply voltage $V_{ccp}$ out of the first and second power supply voltages $V_{ccp}$ and $V_{ini}$ selectively supplied from the power supply scan unit 50 via the power supply line 32 is the power supply voltage to supply the driving transistor 22 with drive current to drive the organic EL element 21 to emit light. Additionally, the second power supply voltage $V_{ini}$ is the power supply voltage to apply reverse bias to the organic EL element 21. The second power supply voltage $V_{ini}$ is set to voltage lower than the reference voltage $V_{ofs}$, for example, the voltage lower than $V_{ofs}$-$V_{th}$, preferably, the voltage sufficiently lower than $V_{ofs}$-$V_{th}$ when threshold voltage of the driving transistor 22 is set to $V_{th}$.

Each of the pixels 20 in the pixel array unit 30 has a function to correct unevenness of drive current caused by variation of characteristics of the driving transistor 22. The characteristics of the driving transistor 22 can include, for example, the threshold voltage $V_{th}$ of the driving transistor 22, and mobility $\mu$ of a semiconductor thin film constituting a channel of the driving transistor 22 (hereinafter simply referred to as "mobility $\mu$ of the driving transistor 22").

Correcting unevenness of the drive current caused by variation of the threshold voltage $V_{th}$ (hereinafter referred to as "threshold correction") is performed by initializing gate voltage $V_g$ of the driving transistor 22 to the reference voltage $V_{ofs}$. Specifically, performed is operation to change source voltage $V_s$ of the driving transistor 22 to potential obtained by subtracting the threshold voltage $V_{th}$ of the driving transistor 22 from initialization voltage while setting, as a reference, the initialization voltage (reference voltage $V_{ofs}$) of the gate voltage $V_g$ of the driving transistor 22. After this operation progresses, the gate-source voltage $V_{gs}$ of the driving transistor 22 eventually converges to the threshold voltage $V_{th}$ of the driving transistor 22. Voltage corresponding to the threshold voltage $V_{th}$ is stored in the storage capacitor 24. Then, since the voltage corresponding to the threshold voltage $V_{th}$ is stored in the storage capacitor 24, dependency of drain-source current $I_{ds}$ flowing in the driving transistor 22 on the threshold voltage $V_{th}$ can be suppressed when the driving transistor 22 is driven by the signal voltage $V_{sig}$ of the video signal.

On the other hand, correcting unevenness of the drive current caused unevenness of the mobility $\mu$ (hereinafter referred to as "mobility correction") is performed by applying current to the storage capacitor 24 via the driving transistor 22 in a state that the writing transistor 23 is in the conductive state and writing the signal voltage $V_{sig}$ of the video signal. In other words, correction is performed by applying negative feedback to the storage capacitor 24 with a feedback amount (correction amount) in accordance with the current $I_{ds}$ flowing in the driving transistor 22. When the video signal is written, dependency of the drain-source current $I_{ds}$ on the threshold voltage $V_{th}$ has been already eliminated by the above-described threshold correction, and the drain-source current $I_{ds}$ comes to depend on the mobility $\mu$ of the driving transistor 22. Therefore, dependency of the drain-source current $I_{ds}$ flowing in the driving transistor 22 on the mobility $\mu$ can be suppressed by applying negative feedback to the drain-source voltage $V_{ds}$ of the driving transistor 22 with the feedback amount in accordance with the current $I_{ds}$ flowing in the driving transistor 22.

[Color Display Method]

Incidentally, the above-described organic EL display device 10 includes a white light emitting system and a red (R), green (G), and IB (blue) mask color coding system as a system to achieve color display (color display system).

The white light emitting system is a system formed by combining a color filter with a white organic EL element in which a light-emitting function layer of one subpixel is formed of a white light-emitting function layer. The light-emitting function layer (organic layer) includes a light emission layer made of an organic light emitting material. Specifically, the light-emitting function layer can be formed of, for example, a stacked structure including a hole transport layer, a light emission layer, and an electron transport layer, a stacked structure of a hole transport layer and a light emission layer serving also as an electron transport layer, a stacked structure including a hole injection layer, a hole transport layer, a light emission layer, an electron transport layer, and an electron injection layer, or the like.

In the case where the stacked structure or the like is a tandem unit, the light-emitting function layer (organic layer) may have a tandem structure including two stages in which a first tandem unit, a connection layer, and a second tandem unit are stacked. Furthermore, the light-emitting function layer may have a tandem structure including three or more stages in which three or more tandem units are stacked. In these cases, a white light-emitting function layer that emits white light as a whole can be achieved by setting different emission colors of red, green, and blue for the respective tandem units, and becomes the while organic EL element having the tandem structure.

The RGB mask color coding system is a system in which the organic EL materials of red, green, and blue are separately colored by vapor deposition utilizing a mask. In the case of the RGB mask color coding system, a light-emitting function layer of one subpixel is formed of a red light-emitting function layer to emit red light, a green light-emitting function layer to emit green light, and a blue light-emitting function layer to emit blue light. Even in an organic EL display device adopting this RGB mask color coding system, a color filter may also be adopted in order to prevent external light reflection at an organic EL element and a wiring electrode between the elements and also to improve color purity.

[Sealing Structure of Display Panel]

In an organic EL display device of color display, a color filter is formed by a pasting method or an on-chip method after forming an organic EL element and a protective film. Then, in both the pasting and on-chip methods, a sealing structure (sealing structure of the display panel 70) is adopted by pasting a second substrate such as a glass substrate to a first substrate on which the organic EL element is formed from a stand point of protecting the organic EL element.

Figure 3:
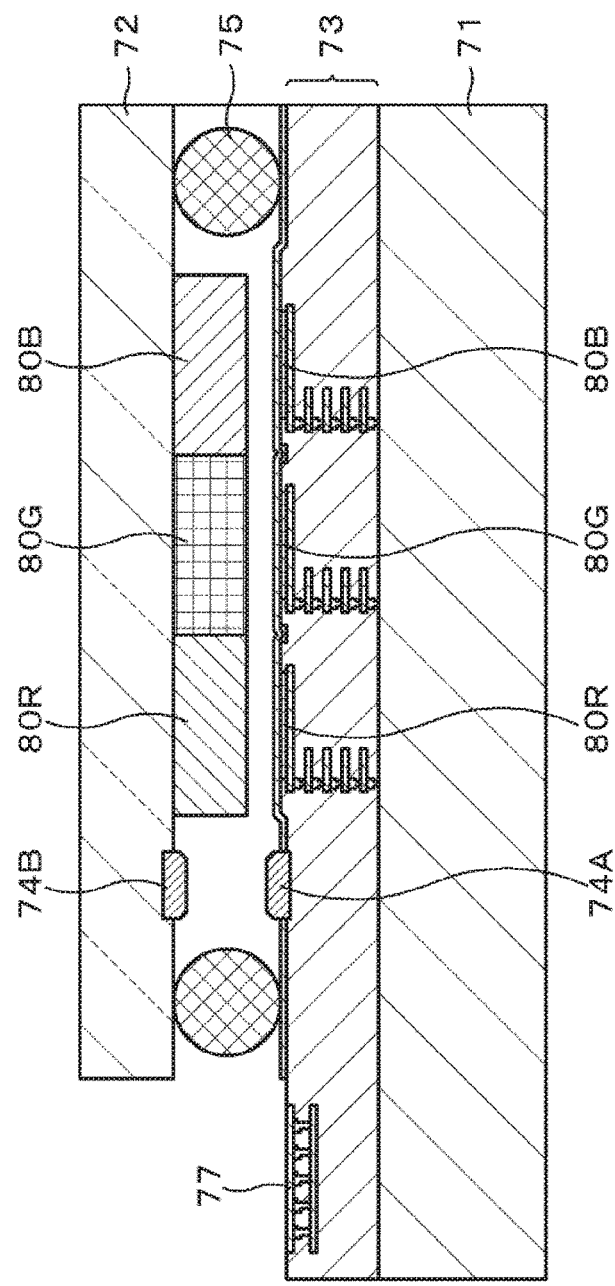
FIG. 3 is a cross-sectional view illustrating a sealing structure of a display panel according to an example in related art.

FIG. 3 is a cross-sectional view illustrating a sealing structure of a display panel according to an example in related art. FIG. 3 illustrates a configuration of one pixel (unit pixel) including three subpixels of, for example, red, green and blue to simplify the drawing.

In the sealing structure of the display panel according to the example in the related art illustrated in FIG. 3, the first substrate 71 is formed of a semiconductor substrate such as a silicon substrate, and the second substrate 72 is formed of a glass substrate such as borosilicate glass. A circuit unit 73 including pixels each including an organic EL element, a drive circuit therefor, wiring and the like is formed on the first surface side (front surface side) of the first substrate 71. Additionally, alignment marks 74A and 74B used for relative positioning for both of the substrates 71 and 72 are provided on each of facing surface sides of the first substrate 71 and the second substrate 72.

Furthermore, color filters 80R, 80G, and 80B are provided between the first substrate 71 and the second substrate 72 in a manner corresponding to three subpixels 20R, 20G, and 20B of red, green, and blue. Additionally, a display area formed by arranging pixels is sealed by providing a spacer 75 in a peripheral portion thereof. When the first substrate 71 is pasted to the second substrate 72, the spacer 75 functions to ensure appropriate substrate spacing such that the two substrates 71, 72 do not contact each other. The inside of the sealed space formed by the spacer 75 is filled with a resin by a known technique.

In the above-described sealing structure of the display panel according to the example in the related art, the spacer 75 is formed by coating the peripheral portion of the display area with a sealing material in which gap materials are dispersed inside a resin made of a photo-curable epoxy resin material. Therefore, in the sealing structure according to the example in the related art, adjusting substrate spacing may be difficult because the number of steps is increased by generating a step to provide the spacer 75 and also substrate spacing between the first substrate 71 and the second substrate 72 is determined by a size of the spacer 75 itself.

First Embodiments

A first embodiment to implement the technology of the present disclosure is made in order to provide a spacer 75 which does not require a step to provide the spacer 75 and also can easily adjust substrate spacing between a first substrate 71 and a second substrate 72.

Incidentally, two patterns can exemplified as a flow from formation of a color resist to assembly of a panel assembly in an organic EL display device of color display. The first pattern is a flow in which sealing is performed by pasting the second substrate 72 formed of, for example, a glass substrate after forming a color resist directly on a protective film of the organic EL element or on a flattening film. The second pattern is a flow in which a black matrix and a color resist are formed on the second substrate 72 side, and then the first substrate 71 which is a back plane substrate formed with the organic EL element and the protective film is pasted to the second substrate 72.

The technology of the present disclosure can be applied to any pattern of the above-described first pattern and second pattern related to the flow from formation of the color resist to assembly of the panel. In the first embodiment described below, a description will be provided by exemplifying a case where the second pattern is applied as the flow from formation of the color resist to assembly of the panel.

Figure 4:
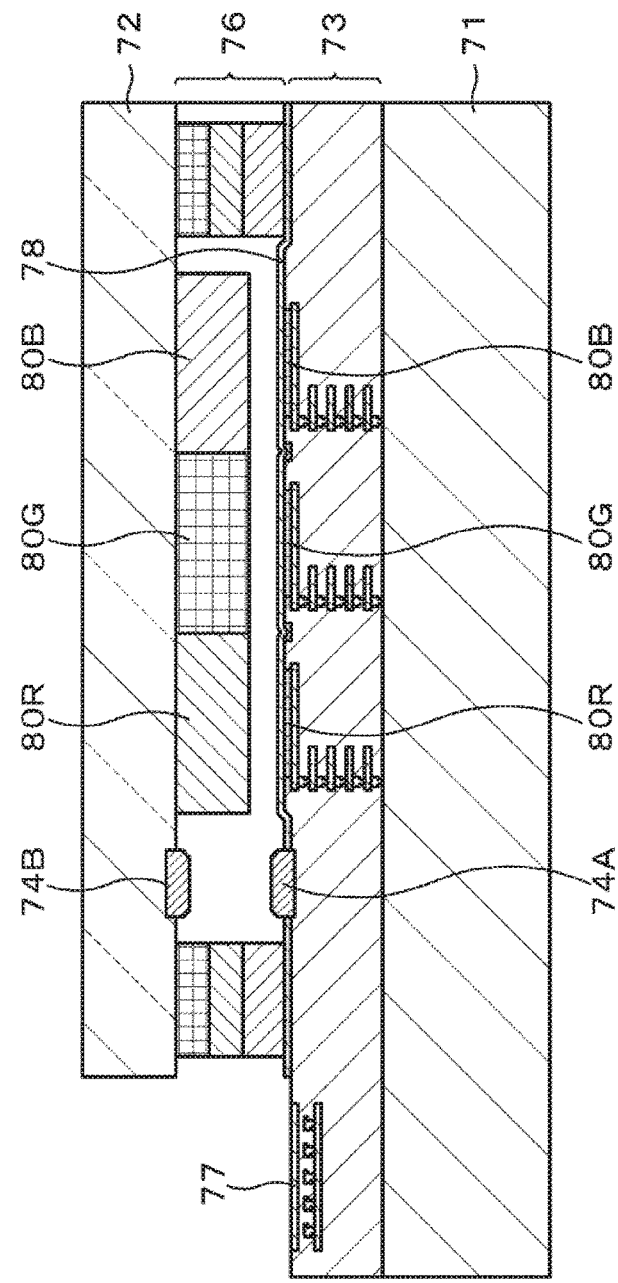
FIG. 4 is a cross-sectional view illustrating a sealing structure of a display panel according to a first embodiment of the present disclosure.

FIG. 4 is a cross-sectional view illustrating a sealing structure of a display panel according to the first embodiment of the present disclosure. In the sealing structure of the display panel according to the first embodiment illustrated in FIG. 4, the first substrate 71 is formed of a semiconductor substrate such as a silicon substrate, and also is a back plane substrate having a first surface side (front surface side) formed with the circuit unit 73 including pixels each including an organic EL element, a drive circuit therefor, wiring and the like. However, the first substrate 71 is not limited to the semiconductor substrate such as the silicon substrate, but can also be formed of a transparent insulation substrate such as a glass substrate.

The second substrate 72 is a counter substrate (or sealing substrate) formed of a transparent insulation substrate, for example, a glass substrate such as borosilicate glass, and arranged in a manner facing the first substrate 71. Since the second substrate 72 is formed of the glass substrate, light can be extracted through the second substrate 72. Consequently, a light extraction system of the present organic EL display device adopts a top emission system in which light is extracted from the second substrate 72 side.

Color filters 80R, 80G, and 80B are provided between the first substrate 71 and the second substrate 72 in a manner corresponding to three subpixels 20R, 20G, and 20B of red, green, and blue including organic EL elements. Furthermore, a spacer 76 to set (ensure) appropriate substrate spacing between the first substrate 71 and the second substrate 72 is provided as a substrate spacing setting unit in at least a peripheral portion (peripheral region) of the display area formed by arranging pixels (subpixels 20R, 20G, and 20B). The spacer 76 ensures appropriate substrate spacing and also has a function to seal a space between the first substrate 71 and the second substrate 72. The inside of the sealed space by the spacer 76 is filled with a resin by a known technique.

The first substrate 71 has a shape having one end portion projecting more than the second substrate 72, that is, has a shape in which one end portion is formed larger than the second substrate 72 in a plan view. A pad portion 77 used for electrical connection to the outside is formed on a surface side (front surface side) located at the one end portion of the first substrate 71 and formed with the circuit unit 73. For example, a flexible printed circuit board (not illustrated) is pressed and joined to the pad portion 77.

The spacer 76 interposed between the first substrate 71 and the second substrate 72 in the peripheral portion of the display area is formed in a step of forming the color filters 80 (80R, 80G, 80B) by using a material same as a material of the color filters 80, namely, the same color resist material. In the present example, since the above-described second pattern is applied as the flow from formation of the color resist to assembly of the panel, the spacer 76 is formed in parallel to formation of the black matrix and the color resist on the second substrate 72 side. The black matrix is formed in order to prevent color mixture of RGB.

For example, the color filters 80R, 80G, and 80B are each formed to have a thickness of about 2 [μm]. Consequently, a gap between lower surfaces of the color filters 80R, 80G, and 80B and the surface of the first substrate 71, specifically, a protective film 78 of the organic EL element is about 0.9 [μm]. On the other hand, the spacer 76 is formed to have a thickness (height) of about 3.6 [μm]. Then, after pasting the first substrate 71 to the second substrate 72, the spacer 76 is compressed until the thickness becomes about 2.7 [μm] from about 3.6 [μm].

[Method of Forming Color Resist]

A color resist is formed on the first substrate 71 by using a photosensitive resist corresponding to each of green, red, and blue. In the case of applying the above-described first pattern as the flow from formation of the color resist to assembly of the panel, the color resist is formed on the second substrate 71 by using a photosensitive resist corresponding to each of green, red, and blue.

Normally, development processing is performed by coating/exposing a color resist, and the color resist is patterned into a predetermined shape, and then the resist is cured by baking or the like. The processing is repeatedly performed for green, red, and blue, and the color filters 80R, 80G, and 80B are formed at positions corresponding to pixels (sub-pixels 20R, 20G, and 20B) inside the panel. According to the present embodiment, the spacer 76 is formed as the substrate spacing setting unit by stacking the color resist in the peripheral region of the display area in the step of forming the color filter, for example, in the order of the color filter 80G, color filter 80R, and color filter SOB by a similar technique.

At the time of forming a color resist, a thickness of a color resist (second layer) to be formed later is varied by influence of a color resist previously formed (first layer). This will be specifically described by exemplifying a case of forming a color resist in a pattern. Here, the "pattern" represents a pattern in which the color resist of the first layer forms projecting and recessed portions in an arbitrary shape in a plane direction, and a relative height of the projecting and recessed portions is controlled, or represents a pattern in which projecting and recessed portions are formed in a cyclic manner in an X direction, a Y-direction, or both X and Y directions at positions to be formed with pillars. Additionally, "forming in a pattern" means forming a color resist in an arbitrary shape by patterning.

In the case of forming the color resist in a pattern of, for example, projecting and recessed stripe-like shape, it is assumed that a color resist formed immediately before has a cross-sectional pitch of a projecting portion (rib) at 6 [μm] with a film thickness of 2 [μm] and a color resist formed later has the pitch of 6 [μm] with a film thickness of 2 [μm] in a similar manner. In this case, a film thickness between the projecting portions (in a recessed portion) of the color resist immediately before is a little over 2 [μm] due to influence of pattern density of the projecting portions of the color resist, but a thickness of a portion coated with the color resist, namely, the projecting portion is 2 [μm] or less. Here, the "pattern density" represents a ratio of an area occupied by a region where the color resist is actually formed in a pattern (e.g., projecting portion) to an area of a color resist forming region.

A film thickness difference is generated between the recessed portion of the color resist immediately before and the projecting portion coated with the color resist because the color resist itself has fluidity and tries to become flat despite a fact that a coating amount of the color resist is fixed to a constant amount. Since the color resist including an underlayer and formed immediately before is formed in a pattern, a total film thickness of the spacer 76 is varied by influence of pattern density thereof in forming the spacer 76 in the peripheral portion of the display area. In other words, the total film thickness (height) of the spacer 76 can be adjusted by forming, in a pattern, the color resist including the underlayer and formed immediately before, and by adjusting pattern density thereof.

Figure 5:
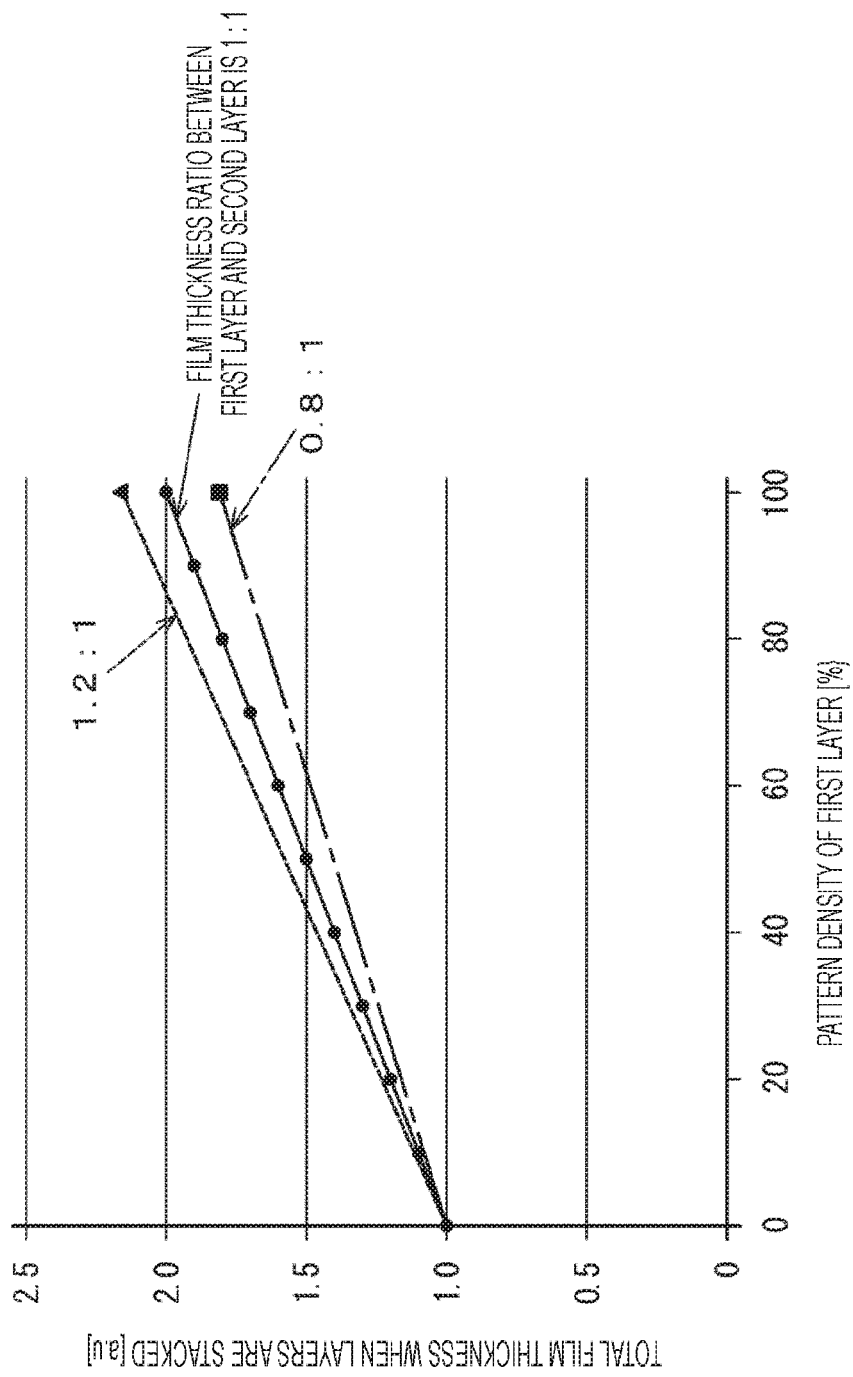
FIG. 5 is a diagram illustrating a relation between pattern density of a first layer (color resist including an underlayer and formed immediately before) and a total film thickness when a spacer is stacked.

FIG. 5 is a diagram illustrating a relation between pattern density of the first layer (color resist formed before) and a total film thickness when the spacer 76 is stacked. In FIG. 5, a case where a ratio (film thickness ratio between the first layer and the second layer) between a film thickness of the first layer (color resist formed before) and a film thickness of the second layer (color resist formed later) is 1:1 is indicated by a solid line, a case of having the ratio 1.2:1 is indicated by a broken line, and a case of having the ratio of 0.8:1 is indicated by a one-dot chain line. For example, in the case where the film thickness ratio between the first layer provided as a first adjustment layer and the second layer provided as a second adjustment layer is 1:1, a total thickness of the first layer is 2 [μm] when the pattern density is 100[%] while a total film thickness is 1.5 [μm] when the pattern density is 50[%].

Thus, the total film thickness of the spacers 76 can be adjusted by forming the first layer in a pattern and adjusting the pattern density thereof at the time of forming the spacer 76 in the step of forming the color filters 80R, 80G, and 80B by using the same color resist material. Here, the description has been provided by exemplifying the case of having the stacked structure including the two layers for easy understanding, but even in the case of having a stacked structure including three or more layers, the matters are similar. For example, in the case of having the stacked structure including three layers, it is possible to have a configuration in which a first layer is formed in a pattern and a second layer and a third layer are sequentially stacked thereon, or a configuration in which a first layer is formed in a pattern, a second layer is also formed in a pattern, and a third layer is stacked thereon.

The color resist of green, red, and blue are used, but in the case of attaching a transparent coating film to the underlayer, four kinds of resists can be used. The spacer 76 can be formed in an arbitrary height by combining a plurality of kinds of resists and superimposing the same while adjusting density of a pattern (pattern density) including the coating film of the underlayer.

[Stacked Structure of Spacer]

Figure 6A:
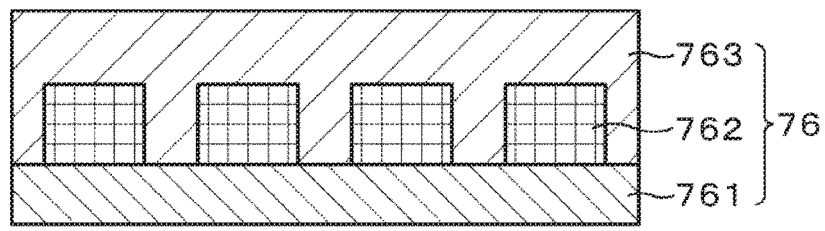
FIGS. 6A, 6B, 6C, and 6D are cross-sectional views illustrating specific examples of a stacked structure of the spacer in the case where both the first layer and a second layer are made of a color resist material.
Figure 6B:
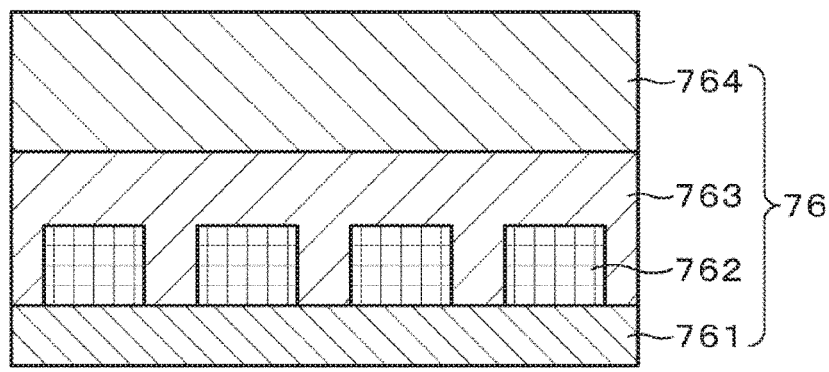

FIGS. 6A, 6B, 6C, and 6D are cross-sectional views illustrating specific examples of a stacked structure of the spacer 76 in the case where both the first layer and the second layer are made of a color resist material. In the example of FIG. 6A, a green color resist 762 is formed in a pattern on an interlayer film 761, and a red color resist 763 is stacked thereon to form a stacked structure including two layers. Since the color resist itself has fluidity, a region where the green color resist 762 does not exist is filled with the red color resist 763. The example of FIG. 6B is an example of a stacked structure including three layers in which a blue color resist 764 is stacked on the red color resist 763 of the example of FIG. 6A.

Figure 6C:
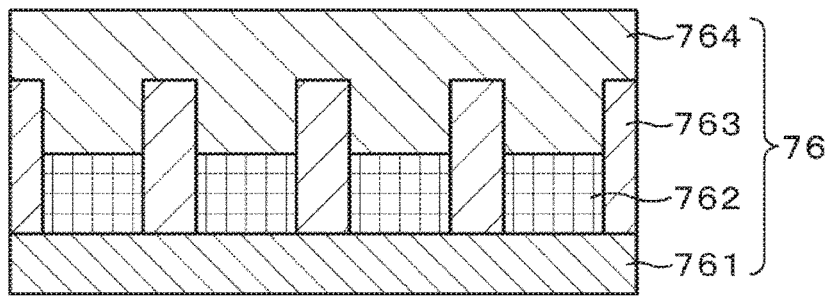

The example of FIG. 6C is an example of a stacked structure including three layers in which a green color resist 762 is formed in a pattern on an interlayer film 761, also a red color resist 763 is formed in a pattern on a region where no green color resist 762 exists, and a blue color resist 764 is stacked thereon. In the case of the example of FIG. 6C, since a region where no red color resist 763 of the second layer exists is filled with the blue color resist 764 of the third layer by forming the red color resist 763 in the pattern on the region where no green color resist 762 exists, the film thickness of the spacer 76 can be made thinner than the thickness in the case of the example of FIG. 6B.

Figure 6D:
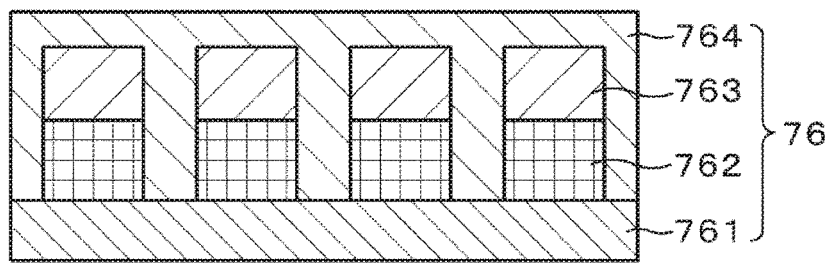

The example of FIG. 6D is an example of a stacked structure including three layers in which a green color resist 762 is formed in a pattern on an interlayer film 761, also a red color resist 763 is formed in a pattern on a region where the green color resist 762 exists, and a blue color resist 764 is stacked thereon. In the case of the example of FIG. 6D, since the region where the green color resist 762 of the first layer and the red color resist 763 of the second layer do not exist is filled with the blue color resist 764 of the third color by forming the red color resist 763 in the pattern on the region where the green color resist 762 exist, the film thickness of the spacer 76 can be made thinner than the film thickness in the case of the example of FIG. 6C.

The examples in FIGS. 6A, 6B, 6C, and 6D are specific examples in the case where both the first layer and the second layer are made of the color resist materials, but a material other than the color resist material can be also used as the first layer.

Figure 7A:
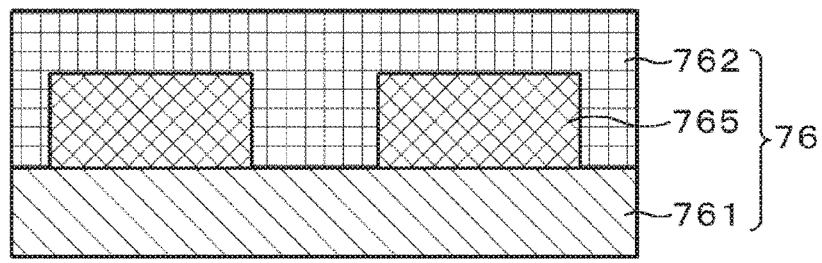
FIGS. 7A, 7B, and 7C are cross-sectional views illustrating specific examples of a stacked structure of the spacer in the case of using a material other than a color resist material for the first layer.
Figure 7B:
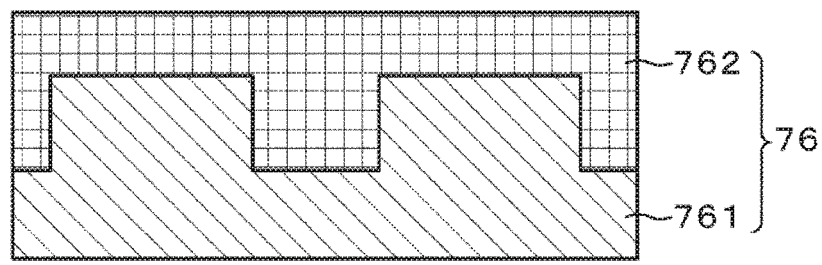
Figure 7C:
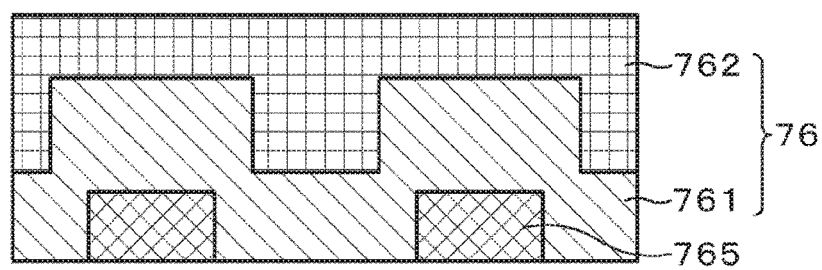

FIGS. 7A, 7B, and 7C illustrate specific examples of a stacked structure of the spacer 76 in the case of using a material other than the color resist material for the first layer. Here, a description will be provided by exemplifying a case of having a stacked structure including two layers for easy understanding, but the description can be applied to a stacked structure including three or more layers in a similar manner.

The example of FIG. 7A is an example in which a first layer is made of a metal material and a second layer is made of a color resist material. Specifically, provided is the stacked structure including two layers in which an aluminum (Al) wiring pattern 765 formed (wired) on an interlayer film 761 is used as a first layer, and a green color resist 762 is stacked on the Al wiring pattern 765 of the first layer. Tungsten (W), titanium (Ti), titanium nitride (TiN), or the like can be used as a wiring material, that is, the metal material of the first layer besides Al.

The example of FIG. 7B is an example in which a first layer is made of an oxide film and a second layer is made of a color resist material. Specifically, provided is a stacked structure including two layers in which the interlayer film (interlayer insulating film) 761 formed of an oxide film is used as the first layer, and the interlayer film 761 of the first layer is formed in a pattern, and then a green color resist 762 is stacked thereon. An insulating material such as SiO, SiN, SiOC, or the like can be exemplified as a material of the interlayer film 761. The interlayer film 761 of the first layer is patterned by lithography and a shape is formed by DET processing.

The example of FIG. 7C is an example in which a first layer is made of an oxide film and a second layer is made of a color resist material in a manner similar to the example of FIG. 7B. While the example of FIG. 7B is the example in which the interlayer film 761 of the first layer is formed in the pattern, the example of FIG. 7C is the example in which an interlayer film 761 of the first layer is formed on an Al wiring pattern 765. Specifically, Al wiring or the like under the interlayer film 761 of the first layer is patterned, and projecting and recessed portions are formed under the interlayer film 761 of the first layer by the Al wiring pattern 765. Therefore, projecting and recessed portions are formed in the inter layer film 761 in accordance with the projecting and recessed portions of the underlayer by forming the interlayer film 761 on the Al wiring pattern 765 in a manner similar to the case of forming the interlayer film 761 in the pattern even without forming the interlayer film 761 in a pattern. This case also included in a concept in which the interlayer film 761 of the first layer is formed in a pattern. In the present example, conformal SiO film formation or nigh density plasma (HDP) film formation to change a shape may also be adopted besides the Al wiring pattern 765.

Figure 8A:
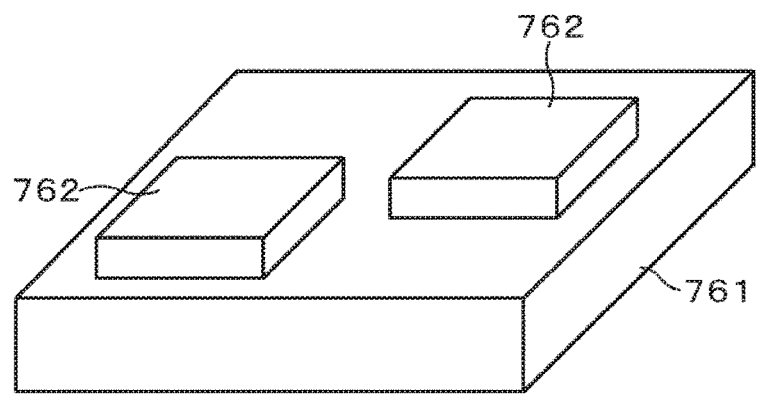
FIG. 8A is a perspective view illustrating a stacked structure in a case where the first layer is formed in a pattern of an island shape.

In the examples illustrated in FIGS. 6 and 7, the description has been provided by exemplifying the case where in which the first layer is formed in a pattern of, for example, the projecting and recessed stripe-like shape, but the pattern is not limited to the stripe-like shape. The first layer may also formed in a pattern of island shape besides stripe-like shape, specifically, a green color resist 762 can be formed in a pattern of, for example, a rectangular island shapes as illustrated in FIG. 8A. FIG. 8A exemplifies, for easy understanding, a configuration in which the green color resist 762 is formed on the interlayer film 761 in a pattern of two rectangular island shapes.

Figure 8B:
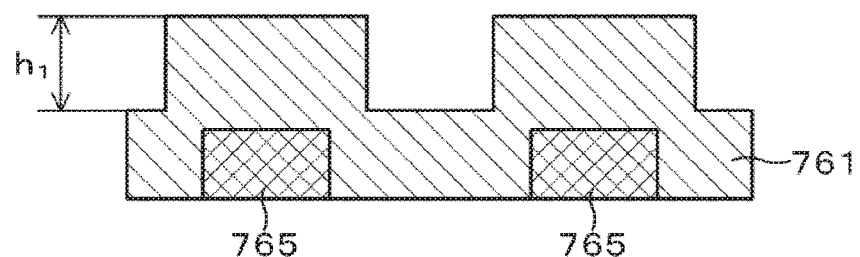
FIG. 8B is a cross-sectional view illustrating a case where a color resist has one relative height.
Figure 8C:
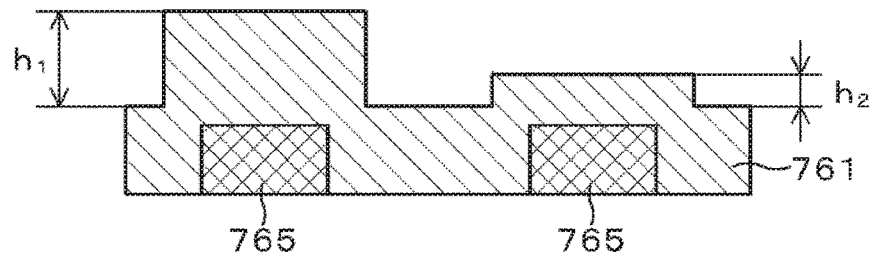
FIG. 8C is a cross-sectional view illustrating a case where the color resist has two relative heights.

In the example of FIG. 8A, it is possible to adopt a configuration in which heights of the two pieces of the color resist 762 can be set to a same height $h_1$ as illustrated in FIG. 8B, in other words, one relative height is set (height $h_1$). Alternatively, it is also possible to have a configuration in which two relative heights are set, such as a height $h_1$ and a height $h_2$, as illustrated in FIG. 8C. FIGS. 8B and 8C correspond to the example in FIG. 7C. The heights of a plurality of pieces of island-shaped color resists 762 can be controlled to have arbitrary heights by performing, for example, grinding by chemical mechanical polishing (CMP) after forming an SiO film. In the case where perfect flattening is not performed, heights of projecting and recessed portions are determined by pattern density (Al wiring pattern 765 in the case of FIG. 8C).

[Pattern Layout]

Subsequently, a pattern layout of a first layer will be described with reference to FIGS. 9A to 13C. FIGS. 9A to 13C are planar pattern diagrams (No. 1 to No. 5) illustrating specific examples of a pattern layout of the first layer in the stacked structure of the spacer.

In FIGS. 9A to 13C, the peripheral portion of the display area of the second substrate 72 (or the first substrate 71) illustrated in FIG. 4, on which the spacer 76 is formed, is to be a pillar forming portion. A pattern (projecting portion) of the first layer is formed in this pillar forming portion. In FIGS. 9A to 13C, a pattern formed of a projecting portion on the first layer is indicated by hatching, and a recessed portion thereof is indicated by an outline for easy understanding. The pattern of the first layer is arrayed in the X direction and the Y direction while setting, as a unit, a square forming region S surrounded by a broken line in FIGS. 9A to 13C, for example.

Figure 9A:
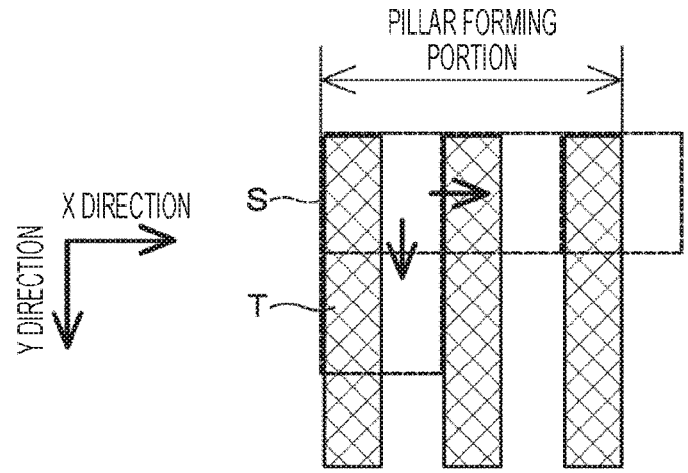
FIGS. 9A to 9C are planar pattern diagrams (No. 1) illustrating specific examples of a pattern layout of the first layer in the stacked structure of the spacer.

The layout illustrated in FIG. 9A has a pattern in which rib-like projecting portions T each extending in the Y direction and having a width of about ½ of the forming region S are arrayed at a pitch of the forming region S in the X direction. The layout illustrated in FIG. 9B has a pattern in which projecting portions T each having a size of about ¼ of the forming region S and having a square planar shape positioned at an upper left corner portion of the forming region S are arrayed in the X direction and the Y direction at a pitch of the forming region S. The layout illustrated in FIG. 9C has a pattern in which projecting portions T each having a size of about ¼ of the forming region S and having a square planar shape positioned at a center of the forming region S are arrayed in the X direction and the Y direction at a pitch of the forming region S.

Figure 9B:
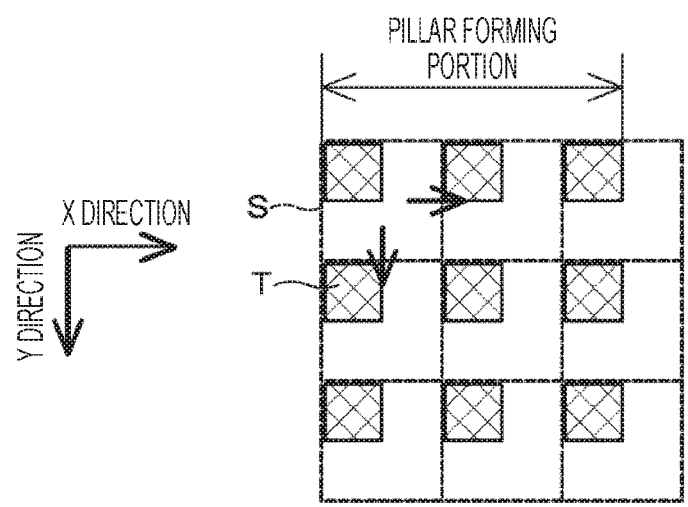
Figure 9C:
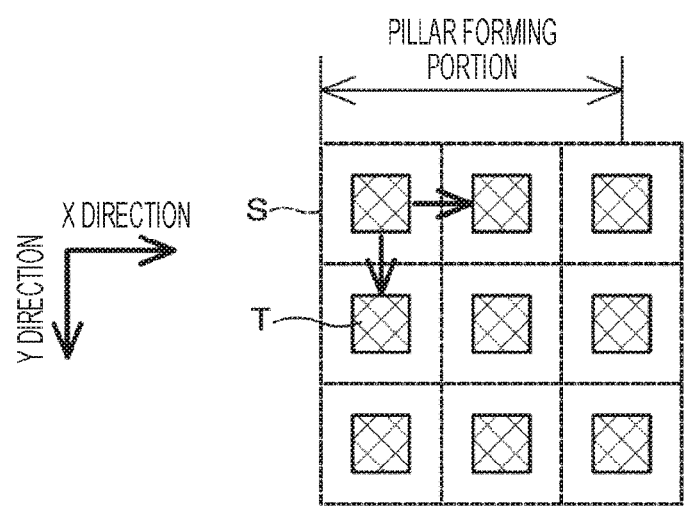

In the layouts illustrated in FIGS. 9A, 9B, and 9C, it is also possible to adopt a layout in which a relation between the projecting portions (hatching portions, similar in the following) and the recessed portions (outlined portion, similar in the following) is switched.

Figure 10A:
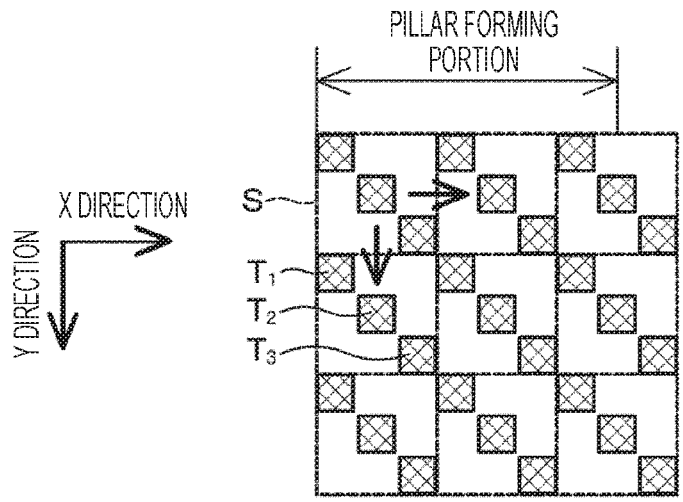
FIGS. 10A to 10C are planar pattern diagrams (No. 2) illustrating specific examples of a pattern layout of the first layer in the stacked structure of the spacer.

The layout illustrated in FIG. 10A has a pattern in which three projecting portions T each having a size of about ⅑ of the forming region S and having a square planar shape are arranged obliquely inside the forming region S, and these three projecting portions $T_1$, $T_2$, and $T_3$ are set as a unit and arrayed in the X direction and the Y direction at a pitch of the forming regions S. The layout illustrated in FIG. 10B has a pattern in which a rib-like projecting portion $T_1$ having a width of about ⅓ of the forming region S and having a length of the forming region S size and a rib-like projecting portion $T_2$ having a width about same as that of the projecting portion $T_1$ and having a length shorter than the projecting portion $T_1$ are set as a unit and arrayed in the X direction and the Y direction at a pitch of the forming regions S. The layout illustrated in FIG. 10C has a pattern in which two projecting portions $T_1$ and $T_2$ each having a width of about ⅓ of the forming region S are arranged apart from each other in a tilted manner inside the forming region S, and these two projecting portions $T_1$ and $T_2$ are set as a unit and arrayed in the X direction and the Y direction at a pitch of the forming region S.

Figure 10B:
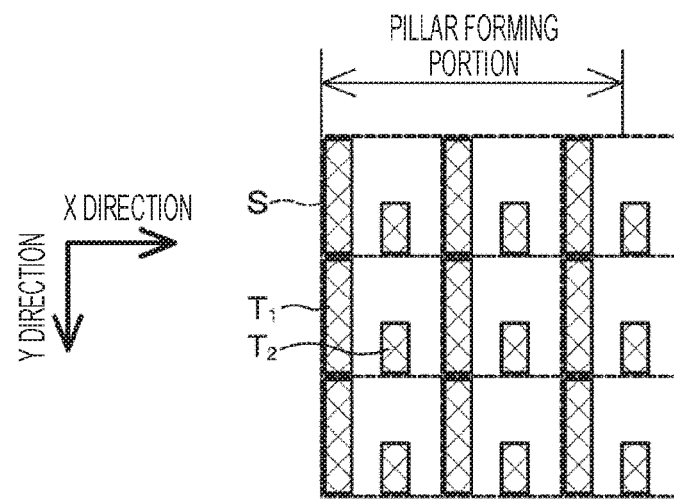
Figure 10C:
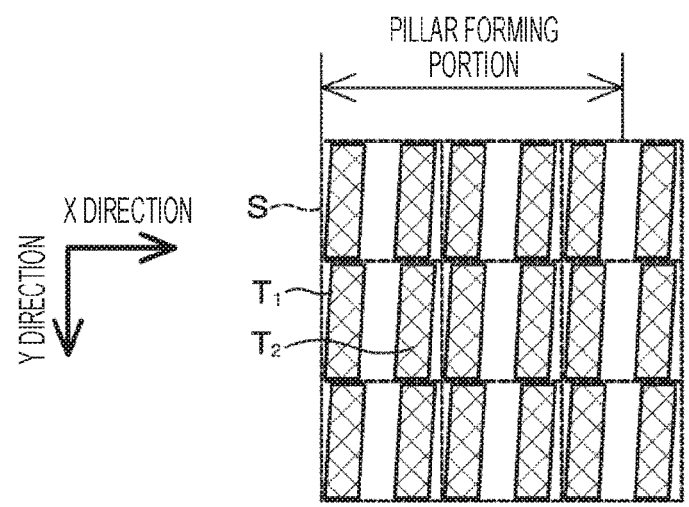

In the layouts illustrated in FIGS. 10A, 10B, and 10C, it is also possible to adopt a layout in which a relation between the projecting portions and the recessed portions is switched.

Figure 11A:
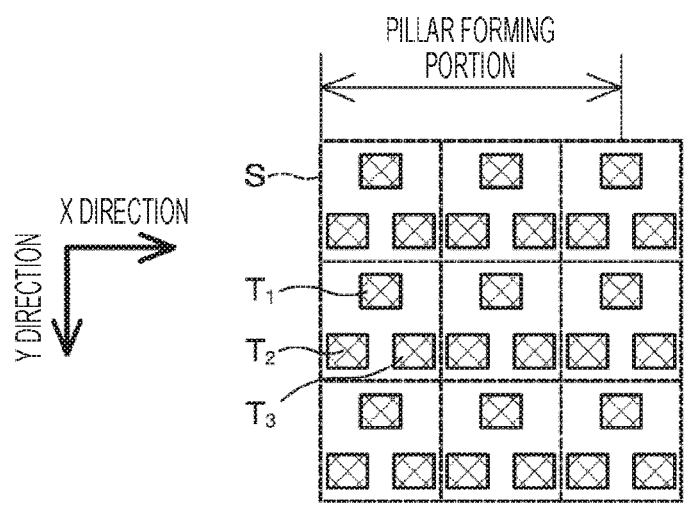
FIGS. 11A to 11B are planar pattern diagrams (No. 3) illustrating specific examples of a pattern layout of the first layer in the stacked structure of the spacer.

The layout illustrated in FIG. 11A has a pattern in which three projecting portions $T_1$, $T_2$, and $T_3$ each having a rectangular planar shape are arranged at positions corresponding to vertices of a triangle inside the forming region S, and these three projecting portions $T_1$, $T_2$, and $T_3$ are set as a unit and arrayed in the X direction and the Y direction at a pitch of the forming regions S. The layout illustrated in FIG. 11B has a pattern in which projecting portions $T_1$ each having a size of ¼ of the forming region S and having a square planar shape and projecting portions $T_2$ each having a size about ½ of the forming region S and having a square planar shape are arranged inside the forming region S, and these two projecting portions $T_1$ and $T_2$ are set as a unit and arrayed in the X direction and the Y direction at a pitch of the forming region S.

Figure 11B:
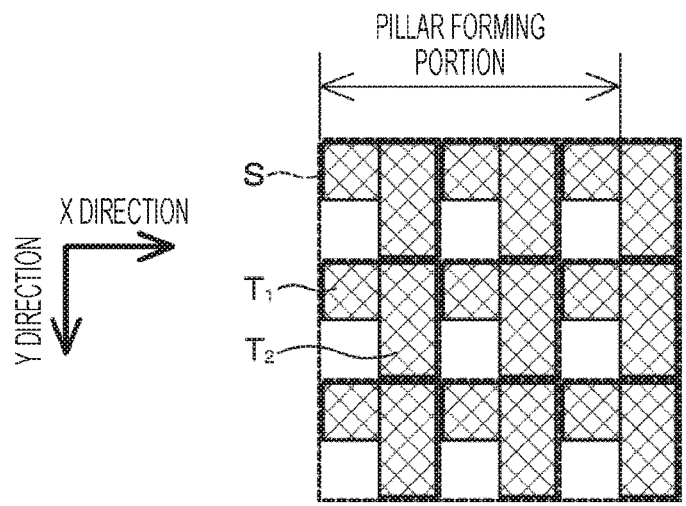

In the layouts illustrated in FIGS. 11A, 11B, and 11C, it is possible to adopt a layout in which a relation between the projecting portions and the recessed portions is switched.

Figure 12A:
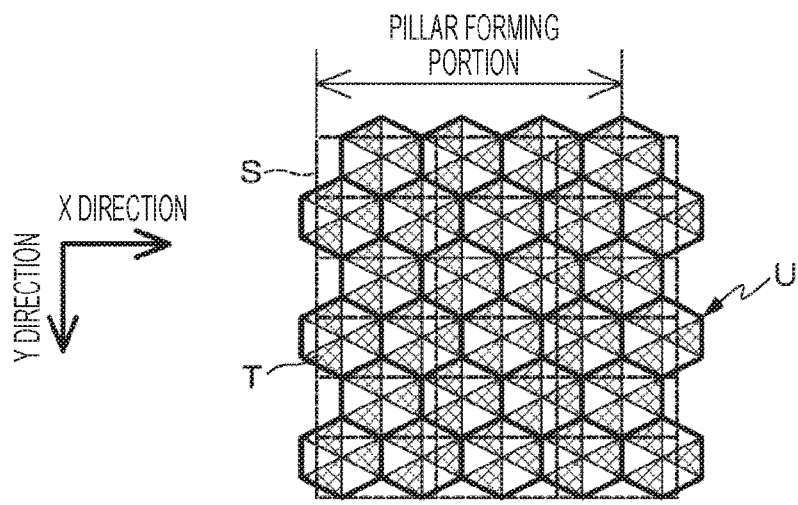
FIGS. 12A to 12B are planar pattern diagrams (No. 4) illustrating specific examples of a pattern layout of the first layer in the stacked structure of the spacer.

The layout illustrated in FIG. 12A has a pattern in which discontinuous three triangular projecting portions T obtained by equally dividing a basic shape U having a hexagonal planar shape into six equal parts, and the basic shapes U each including these three projecting portions T are arrayed adjacent to each other. The layout illustrated in FIG. 12B has a pattern in which six triangular projecting portions T obtained by equally dividing a basic shape U having a hexagonal planar shape into six equal parts and the basic shapes U each including the six projecting portions T are arrayed at every third piece in a direction.

Figure 12B:
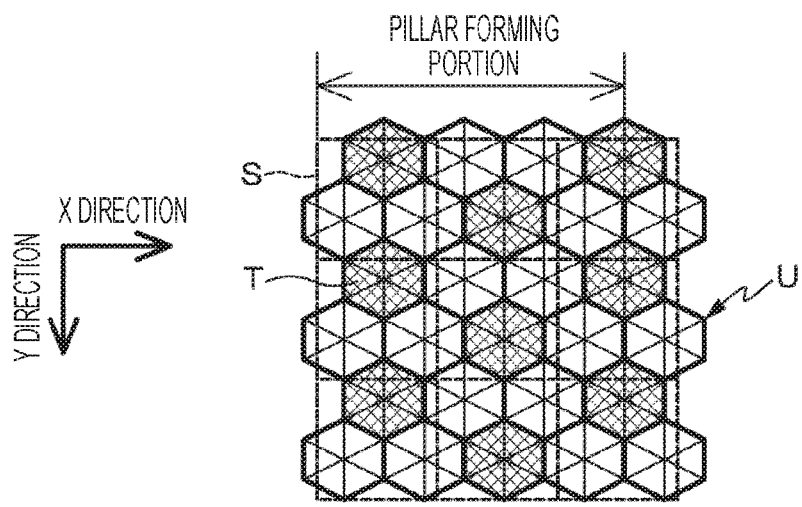

In the layouts illustrated in FIGS. 12A and 12B, it is also possible to adopt a layout in which a relation between the projecting portions and the recessed portions is switched.

Figure 13A:
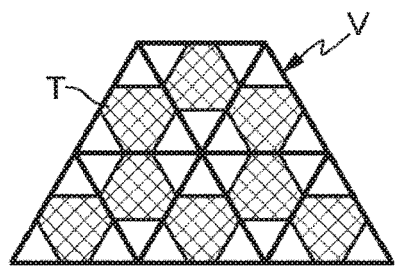
FIGS. 13A to 13C are planar pattern diagrams (part 5) illustrating specific examples of a pattern layout of the first layer in the stacked structure of the spacer.
Figure 13B:
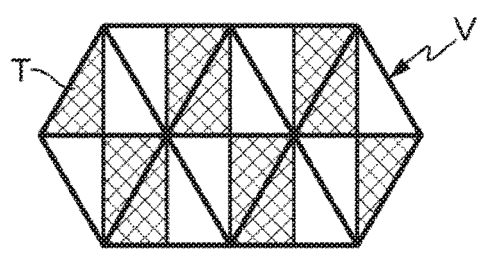
Figure 13C:
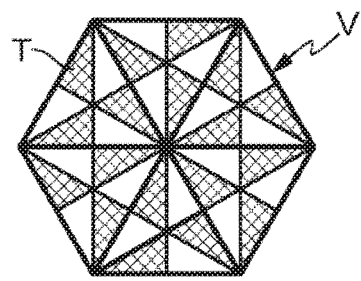

FIGS. 13A, 13B, and 13C have patterns in each of which basic shapes V each having a triangular planar shape are arranged in a delta, and a shape of a projecting portion T formed inside the basic shape V is different between three exemplary patterns. In the layouts illustrated in FIGS. 13A, 13B, and 13C, it is also possible to adopt a layout in which a relation between the projecting portions and the recessed portions is switched.

According to the above-described sealing structure of the display panel according to the first embodiment, the step to form the spacer 76 is not needed because the spacer 76 to set appropriate substrate spacing between the first substrate 71 and the second substrate 72 is formed in the step of forming the color filter 80 by using the material same as that of the color filter 80. Consequently, the number of steps in manufacturing the display panel can be more reduced than that of the related art described in Patent Document 1.

Additionally, since the second layer (second adjustment layer) is stacked on the first layer (first adjustment layer) formed in a pattern, a film thickness difference is generated between a recessed portion and a projecting portion of the first layer because the color resist itself of the second layer itself has fluidity and tries to become flat. Therefore, the thickness of the second layer, furthermore, the total height of the spacer 76 can be adjusted by adjusting pattern density of the first layer. Consequently, substrate spacing between the first substrate 71 and the second substrate 72, which is determined by the height of the spacer 76, can be easily adjusted.

In the case of a small display having a size of about 1 inch or less used for an electronic view finder (EVF) or a head mounted display, a pixel size/pitch is extremely small compared to a direct view type such as a middle/large display. Therefore, in the small display having the size of about 1 inch or less, importance is placed on viewing angle characteristics to maintain an appropriate color and luminance. Therefore, the sealing structure of the display panel according to the present embodiment in which adjustment of substrate spacing between the first substrate 71 and the second substrate 72 can be easily performed is particularly useful for the small display having the size of about 1 inch or less because appropriate viewing angle characteristics can be easily obtained by adjusting substrate spacing.

Second Embodiment

A second embodiment also has a sealing structure of a display panel similar to that of a first embodiment. In other words, provided is a configuration in which a step to form a spacer 76 is not needed and substrate spacing can be easily adjusted by forming at least a first layer in a pattern and forming the spacer 76 in a step of forming a color filter 80 by using a material same as a material of the color filter 80. However, in the first embodiment, a transparent insulation substrate such as a glass substrate can be used as a first, substrate 71 besides a semiconductor substrate such as a silicon substrate. On the other hand, in the second embodiment, it is a premise to use a semiconductor substrate such as a silicon substrate as the first substrate 71.

Figure 14:
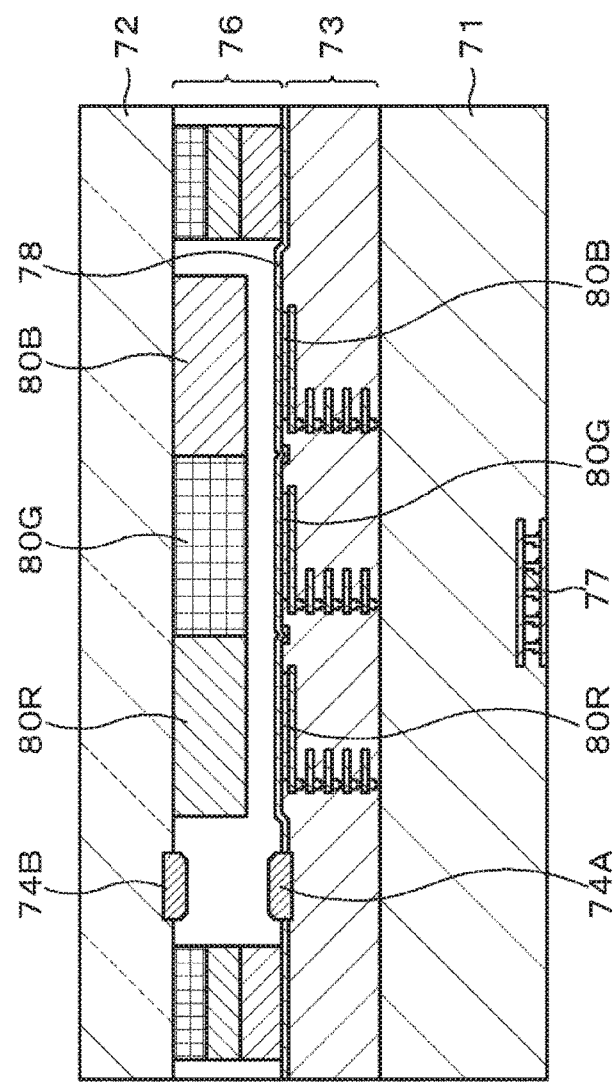
FIG. 14 is a cross-sectional view illustrating a sealing structure of a display panel according to a second embodiment of the present disclosure.

FIG. 14 is a cross-sectional view illustrating the sealing structure of the display panel according to the second embodiment of the present disclosure. In FIG. 14, the first substrate 71 is formed of a semiconductor substrate such as a silicon substrate and also is a back plane substrate having a first surface side (front surface side) formed with a circuit unit 73 including pixels each including an organic EL element, a drive circuit therefor, wiring and the like. A pad portion 77 used for electrical connection to outside is formed on a second surface side (back surface side) of the first substrate 71 In other words, since the first substrate 71 is formed of the semiconductor substrate, adopted is a back surface through-electrode structure in which the circuit unit 73 on the front surface side is electrically connected to the pad portion 77 on the back surface side through the substrate. For example, a flexible printed circuit board (not illustrated) is pressed and jointed to the pad portion 77.

Since adopted is the configuration in which the pad portion 77 is provided on the back surface side of the first substrate 71 that is the back plane substrate, a chip size (planer shaped substrate size/panel size) can be made smaller than that of the display panel according to the first embodiment as apparent from comparison with FIG. 4. Consequently, theoretical yield (theoretical yield) can be improved. Additionally, a stacked structure in which a semiconductor substrate is further stacked on the first substrate 71 can also be adopted for the back plane substrate. A size of a planar shape of the first substrate 71, furthermore, an entire size of a planar shape of the back plane substrate can be more reduced by adopting the stacked structure for the back plane substrate and mounting, on the semiconductor substrate to be stacked, a part or an entire portion of a circuit of the circuit unit 73 mounted on the first substrate 71.

<Electronic Device>

The above-described display device of the present disclosure is used as a display unit (display device) of an electronic device in every field to display, as an image or video, a video signal received in the electronic device or a video signal generated in the electronic device. For example, the display device of the present disclosure can be used as a display unit of a television set, a digital still camera, a laptop personal computer, a mobile terminal device such as a cellular phone, a video camera, a head mounted display (a head mounted type display), or the like.

Following effects can be obtained by using the display device of the present disclosure as the display unit of an electronic device in every field. In other words, according to the technology of the present disclosure, since substrate spacing can be easily adjusted, substrate spacing that may influence the viewing angle characteristics can be appropriately set and an appropriate color and luminance can be maintained, and therefore contribution to improvement of display quality can be obtained.

The display device of the present disclosure also includes a module-shaped component having a sealed configuration. An example is a display module formed by pasting a counter portion such as transparent glass to a pixel array unit. Note that the display module may be provided with a circuit unit to receive and output a signal and the like to the pixel array unit from outside, a flexible printed circuit (FPC), and the like. In the following, a digital still camera and a head mounted display will be exemplified as specific examples of the electronic device using the display device of the present disclosure. However, the specific examples exemplified here are merely examples, and the present invention is not limited thereto.

Specific Example 1

Figure 15A:
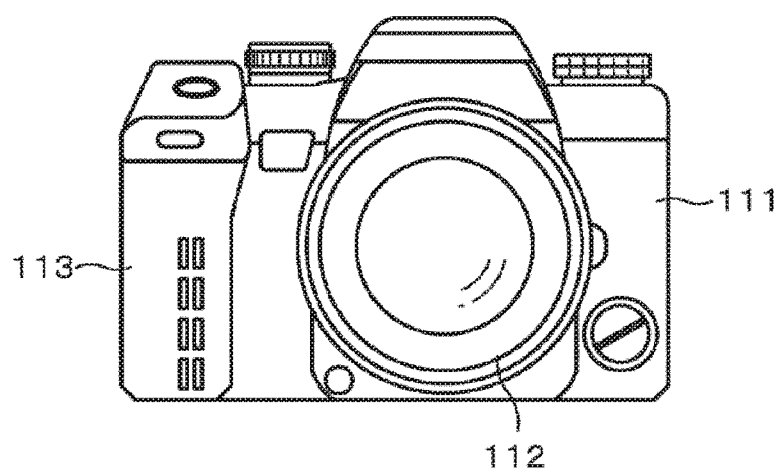
FIGS. 15A and 15B are external views of a single lens reflex digital still camera with interchangeable lenses.
Figure 15B:
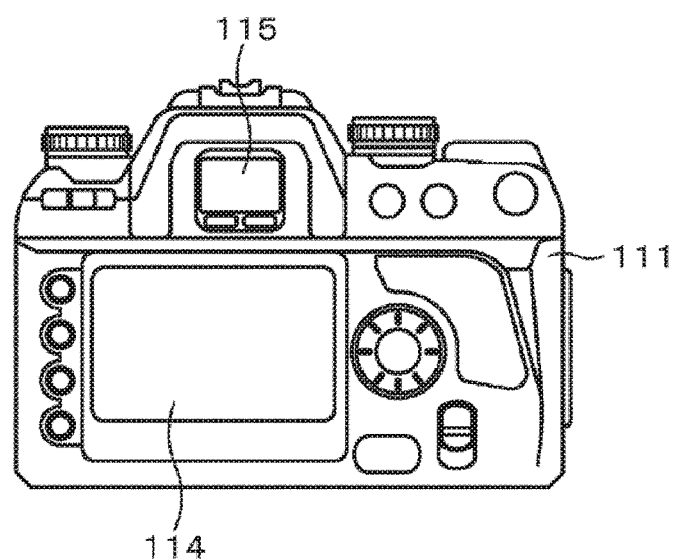

FIGS. 15A and 15B are external views of a single lens reflex digital still camera with interchangeable lenses, FIG. 15A illustrates a front view thereof, and FIG. 15B illustrates a rear view thereof. The single lens reflex digital still camera with interchangeable lenses includes, for example: an interchangeable photographing lens unit (interchangeable lens) 112 on a front right side of a camera main body (camera body) 111; and a grip portion 113 on a front left side to be gripped by a photographer.

Additionally, a monitor 114 is provided substantially at a center of a rear surface of the camera main body 111. A view finder (eyepiece window) 115 is provided above the monitor 114. A photographer can visually recognize an optical image of a subject guided from the photographing lens unit 112 and determine composition by looking into the view finder 115.

In the single lens reflex digital still camera with interchangeable lenses having the above-described structure, the display device of the present disclosure can be used as the view finder 115. In other words, the single lens reflex digital still camera with interchangeable lenses according to the present example is manufactured by using the display device of the present disclosure as the view finder 115 therefor.

Specific Example 2

Figure 16:
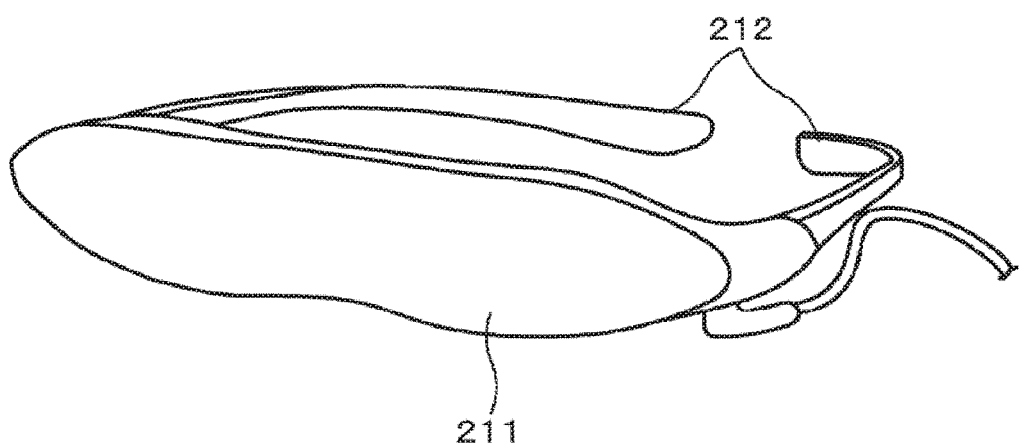
FIG. 16 is an external view of a head mounted display.

FIG. 16 is an external view of a head mounted display. The head mounted display includes, on both sides of a display unit 211 shaped like glasses, ear hooking portions 212 used for attachment to a user's head. In this head mounted display, the display device of the present disclosure can be used as the display unit 211. In other words, the head mounted display according to the present example is manufactured by using the display device of the present disclosure as the display unit 211 therefor.

Furthermore, the present disclosure can also have following configurations.

[1] A display device including a first substrate on which a pixel including a light emitting portion is formed;

a second substrate arranged in a manner facing the first substrate;

a color filter provided between the first substrate and the second substrate; and a substrate spacing setting unit provided in at least a peripheral portion of a display area of the first substrate made by forming pixels, and adapted to set substrate spacing between the first substrate and the second substrate, in which the substrate spacing setting unit is formed of at least two layers including:

a first adjustment layer formed in a predetermined pattern on the first substrate; and a second adjustment layer stacked on the first adjustment layer in a step of forming the color filter by using a material same as a material of the color filter.

[2] The display device according to the above [1], in which the first adjustment layer is formed in a pattern in the step of forming the color filter by using the material same as the material of the color filter.

[3] The display device according to [1], in which the first adjustment layer is formed in a pattern by using a metal material.

[4] The display device according to the above [3], in which the first adjustment layer is formed of a metal wiring pattern.

[5] The display device according to [1], in which the first adjustment layer is formed in a pattern by using an oxide film.

[6] The display device according to any one of the above [1] to [5], in which the first substrate is formed of a semiconductor substrate.

[7] The display according to the above [6], in which the first substrate includes a pad portion formed on a surface side opposite to a surface on which a pixel is formed, and used for electrical connection to outside.

[8] A manufacturing method for a display device that includes:
a first substrate on which a pixel including a light emitting portion is formed;
a second substrate arranged in a manner facing the first substrate;
a color filter provided between the first substrate and the second substrate; and
a substrate spacing setting unit provided in at least a peripheral portion of a display area of the first substrate made by forming pixels, and adapted to set substrate spacing between the first substrate and the second substrate,
the manufacturing method including:
forming a first adjustment layer in a predetermined pattern on the first substrate; and
subsequently stacking a second adjustment layer on the first adjustment layer in a step of forming the color filter by using a material same as a material of the color filter to form the substrate spacing setting unit including at least two layers.

[9] An electronic device including a display device that includes:
a first substrate on which a pixel including a light emitting portion is formed;
a second substrate arranged in a manner facing the first substrate;
a color filter provided between the first substrate and the second substrate; and
a substrate spacing setting unit provided in at least a peripheral portion of a display area of the first substrate made by forming pixels, and adapted to set substrate spacing between the first substrate and the second substrate,
in which the substrate spacing setting unit is formed of at least two layers including:
a first adjustment layer formed in a predetermined pattern on the first substrate; and
a second adjustment layer stacked on the first adjustment layer in a step of forming the color filter by using a material same as a material of the color filter,

REFERENCE SIGNS LIST

10 Organic EL display device
20 (20R, 20G, 20B) Unit pixel (pixel/pixel circuit)
21 Organic EL element
22 Driving transistor
23 Writing transistor
24 Storage capacitor
25 Auxiliary capacitor
30 Pixel array unit
31 ($31_1$ to $31_m$) Scanning line
32 ($32_1$ to $32_m$) Power supply line
33 ($33_1$ to $33_n$) Signal line
34 Common power supply line
40 Writing scan unit
50 Power supply scan unit
60 Signal output unit
70 Display panel
71 First substrate
72 Second substrate
73 Circuit unit
75, 76 Spacer
77 Pad portion
78 Protective film
80 (80R, 80G, 80B) Color filter

The invention claimed is:

1. A display device comprising:
a first substrate on which a pixel is formed in a display area of the first substrate, the pixel including a light emitting element and drive circuitry;
a protective film formed on the first substrate, the protective film being formed over the light emitting element in the display area and extending over a peripheral portion of the first substrate;
a second substrate arranged in a manner facing the first substrate;
a color filter provided between the first substrate and the second substrate; and
a substrate spacer located at the peripheral portion of the first substrate, and configured to set substrate spacing between the first substrate and the second substrate,
wherein the substrate spacer is formed of at least two layers including:
a first adjustment layer formed in a first pattern and arranged in contact with the protective film formed on the first substrate; and
a second adjustment layer stacked on the first adjustment layer and formed in a second pattern that is a different shape from the first pattern, by using a material same as a material of the color filter.

2. The display device according to claim 1, wherein the first adjustment layer is formed in a pattern in the step of forming the color filter by using the material same as the material of the color filter.

3. The display device according to claim 1, wherein the first adjustment layer is formed in a pattern by using a metal material.

4. The display device according to claim 3, wherein the first adjustment layer is formed of a metal wiring pattern.

5. The display device according to claim 1, wherein the first adjustment layer is formed in a pattern by using an oxide film.

6. The display device according to claim 1, wherein the first substrate is of a semiconductor substrate.

7. The display device according to claim 6, wherein the first substrate includes a pad portion formed on a surface side opposite to a surface on which a pixel is formed, and used for electrical connection to outside.

8. The display device according to claim 1, wherein the substrate spacing is set by the substrate spacer according to a compression formation to a predetermined height.

9. The display device according to claim 8, wherein the predetermined height is about 3.6 μm.

10. A manufacturing method for a display device that includes:
a first substrate on which a pixel is formed in a display area of the first substrate, the pixel including a light emitting element and drive circuitry;
a protective film formed on the first substrate, the protective film being formed over the light emitting element over the display area and extending over a peripheral portion of the first substrate;
a second substrate arranged in a manner facing the first substrate;
a color filter provided between the first substrate and the second substrate; and
a substrate spacer located at the peripheral portion of the first substrate, and configured to set substrate spacing between the first substrate and the second substrate, the manufacturing method comprising:
forming a first adjustment layer in a first pattern and in contact with the first protective film formed on on the first substrate; and
subsequently stacking a second adjustment layer on the first adjustment layer, the second adjustment layer being formed in a second pattern that is a different shape from the first pattern, by using a material same as a material of the color filter, to form the substrate spacer to include at least two layers.

11. An electronic device comprising a display device that includes:
a first substrate on which a pixel is formed in a display area of the first substrate, the pixel including a light emitting element and drive circuitry;
a protective film formed on the first substrate, the protective film being formed over the light emitting element in the display area and extending over a peripheral portion of the first substrate;
a second substrate arranged in a manner facing the first substrate;
a color filter provided between the first substrate and the second substrate; and
a substrate spacer located at the peripheral portion of the first substrate, and configured to set substrate spacing between the first substrate and the second substrate,
wherein the substrate spacer is formed of at least two layers including:
a first adjustment layer formed in a first pattern and arranged in contact with the protective film formed on the first substrate; and
a second adjustment layer stacked on the first adjustment layer and formed in a second pattern that is a different shape from the first pattern, by using a material same as a material of the color filter.

12. The electronic device according to claim 11, wherein the first adjustment layer is formed in a pattern in the step of forming the color filter by using the material same as the material of the color filter.

13. The electronic device according to claim 11, wherein the first adjustment layer is formed in a pattern by using a metal material.

14. The electronic device according to claim 13, wherein the first adjustment layer is formed of a metal wiring pattern.

15. The electronic device according to claim 11, wherein the first adjustment layer is formed in a pattern by using an oxide film.

16. The electronic device according to claim 11, wherein the first substrate is of a semiconductor substrate.

17. The electronic device according to claim 16, wherein the first substrate includes a pad portion formed on a surface side opposite to a surface on which a pixel is formed, and used for electrical connection to outside.

18. The electronic device according to claim 11, wherein the substrate spacing is set by the substrate spacer according to a compression formation to a predetermined height.

19. The electronic device according to claim 18, wherein the predetermined height is about 3.6 µm.

* * * * *